US009032348B2

(12) United States Patent
Barnaby et al.

(10) Patent No.: US 9,032,348 B2
(45) Date of Patent: May 12, 2015

(54) PHYSICS-BASED RELIABILITY MODEL FOR LARGE-SCALE CMOS CIRCUIT DESIGN

(71) Applicants: Arizona Board of Regents on behalf of Arizona State University, Scottsdale, AZ (US); University of Southern California, Los Angeles, CA (US)

(72) Inventors: Hugh James Barnaby, Tempe, AZ (US); Ivan Sanchez Esqueda, Venice, CA (US)

(73) Assignees: Arizona Board of Regents on behalf of Arizona State University, Scottsdale, AZ (US); University of Southern California, Los Angeles, CA (US)

( * ) Notice: Subject to any disclaimer, the term of this patent is extended or adjusted under 35 U.S.C. 154(b) by 0 days.

(21) Appl. No.: 14/100,712

(22) Filed: Dec. 9, 2013

(65) Prior Publication Data

US 2014/0165017 A1 Jun. 12, 2014

Related U.S. Application Data

(60) Provisional application No. 61/734,533, filed on Dec. 7, 2012.

(51) Int. Cl.
*G06F 17/50* (2006.01)

(52) U.S. Cl.
CPC ........ *G06F 17/5036* (2013.01); *G06F 17/5081* (2013.01)

(58) Field of Classification Search
None
See application file for complete search history.

(56) References Cited

U.S. PATENT DOCUMENTS

| | | | | |
|---|---|---|---|---|
| 5,761,082 | A * | 6/1998 | Miura-Mattausch | 703/14 |
| 7,263,477 | B2 * | 8/2007 | Chen et al. | 703/13 |
| 7,685,543 | B2 * | 3/2010 | Tsuji et al. | 716/106 |

OTHER PUBLICATIONS

McAndrew et al., "Accuracy of Approximations in MOSFET Charge Models," IEEE Trans. on Electron Devices, vol. 49, No. 1, Jan. 2002, pp. 72-81.*

Wu et al., "Physics-Based Mathematical Conditioning of the MOSFET Surface Potential Equation," IEEE Trans. on Electron Devices, vol. 51, No. 7, Jul. 2004, pp. 1196-1200.*

Thoan et al., "Interface state energy distribution and Pb defects at Si(110)/SiO2 interfaces: Comparison to (111) and (100) silicon orientations," Journal of Applied Physics, vol. 109, No. 013710, 2011 American Institute of Physics, 7 pages.*

Chen et al., "Analytical approximation for the MOSFET surface potential," Solid State Electronics 45, 2001, pp. 335-339.*

(Continued)

*Primary Examiner* — Leigh Garbowski
(74) *Attorney, Agent, or Firm* — Withrow & Terranova, P.L.L.C.

(57) ABSTRACT

This disclosure relates generally to systems and methods for simulating physical active semiconductor components using in silico active semiconductor components. To simulate charge degradation effect(s) in a circuit simulation, a simulated defect signal level is produced. More specifically, the simulated defect signal level simulates at least one charge degradation effect in the in silico active semiconductor component as a function of simulation time and a simulated input signal level of a simulated input signal. As such, the charge degradation effect(s) are simulated externally with respect to the in silico active semiconductor component. In this manner, the in silico active semiconductor component does not need to be reprogrammed in order to simulate charge degradation effects.

25 Claims, 15 Drawing Sheets

(56) References Cited

OTHER PUBLICATIONS

Chen et al., "An extended analytical approximation for the MOSFET surface potential," Solid State Electronics 49, 2005, pp. 267-270.*
Asenov et al., "Statistical aspects of NBTI/PBTI and impact on SRAM yield," 2011 EDAA, 6 pages.*
Gildenblat et al., "PSP: An Advances Surface-Potential-Based MOSFET Model for Circuit Simulation," IEEE Trans. on Electron Devices, vol. 53, No. 9, Sep. 2006, pp. 1979-1993.*
Gu et al., "A Surface Potential-Based Compact Model of n-MOSFET Gate-Tunneling Current," IEEE Trans. on Electron Devices, vol. 51, No. 1, Jan. 2004, pp. 127-135.*
Winokur et al., "Correlating the Radiation Response of MOS Capacitors and Transistors," IEEE Trans. on Nuclear Science, vol. NS-31, No. 6, Dec. 1984, pp. 1453-1460.*
Wang et al., "The Impact of NBTI Effect on Combinational Circuit: Modeling, Simulation,a nd Analysis," IEEE Trans. on VLSI Systems, vol. 18., No. 2, Feb. 2010, pp. 173-183.*
Panagopoulos et al., "A Three-Dimensional Physical Model for the Vth Variations Considering the Combined Effect of NBTI and RDF," IEEE Trans. on Electron Devices, vol. 58, No. 8, Aug. 2001, pp. 2337-2346.*
Kang et al., "Impact of Negative-Bias Temperature Instability in Nanoscale SRAM Array: Modeling and Analysis," IEEE Trans. on CAD of ICs & Systems, vol. 26, No. 10, Oct. 2007, pp. 1770-1781.*
Huard et al., "CMOS Device Design-In Reliability Approach in Advanced Nodes," IEEE 47$^{th}$ Annual Int'l reliability Physics Symposium, 2009, pp. 624-633.*
Huard et al., "Two independent components modeling for Negative Bias Temperature Instability," 2010 IEEE, pp. 33-42.*
Esqueda et al., "Modeling Inter-Device Leakage in 90 nm Bulk CMOS Devices," IEEE Trans. on Nuclear Science, vol. 58, No. 3, Jun. 2011, pp. 793-799.*
Esqueda et al., "Modeling the Non-Uniform Distribution of Radiation-Induced Interface Traps," IEEE Trans. on Nuclear Science, vol. 59, No. 4, Aug. 2012, pp. 723-727.*
Barnaby et al., "Modeling Ionizing Radiation Effects in Solid State Materials and CMOS Devices," IEEE 2008 Custom Integrated Circuits Conference, pp. 273-280.*
Esqueda, I. et al., "Defect-Based Compact Model for Circuit Reliability Simulation in Advanced CMOS Technologies," 2013 IEEE International Integrated Reliability Workshop Final Report (IRW), Oct. 2013, IEEE, pp. 45-49.
Esqueda, I. et al., "A defect-based compact modeling approach for the reliability of CMOS devices and integrated circuits," Solid-State Electronics, vol. 91, Jan. 2014, Elsevier Ltd., pp. 81-86.
Bhardwaj, S. et al., "Predictive Modeling of the NBTI Effect for Reliable Design," IEEE 2006 Custom Integrated Circuits Conference (CICC), Sep. 10-13, 2006, San Jose, CA, IEEE, pp. 189-192.
Grasser, T. et al., "The 'Permanent' Component of NBTI: Composition and Annealing," 2011 IEEE International Reliability Physics Symposium (IRPS), Apr. 10-14, 2011, Monterey, CA, IEEE, pp. 6A.2.1-6A.2.9.
Grasser, T. et al., "A Two-Stage Model for Negative Bias Temperature Instability," 2009 IEEE International Reliability Physics Symposium, Apr. 26-30, 2009, Montreal, QC, IEEE, pp. 33-44.
Kambour, K. E. et al., "Tunneling Discharge of Positive Trapped Oxide Charge in p-channel Field Effect Transistors," Applied Physics Letters, vol. 99, Issue 8, Aug. 2011, AIP, pp. 083506-083506-3.
Kim, T. et al., "Silicon Odometer: An On-Chip Reliability Monitor for Measuring Frequency Degradation of Digital Circuits," IEEE Journal of Solid-State Circuits, vol. 43, No. 4, Apr. 2008, IEEE, pp. 874-880.
Neugroschel, A. et al., "An Accurate Lifetime Analysis Methodology Incorporating Governing NBTI Mechanisms in High-k/SiO2 Gate Stacks," International Electron Devices Meeting (IEDM '06), Dec. 11-13, 2006, San Francisco, CA, IEEE, 4 pages.
Reddy, V. et al., "Impact of Negative Bias Temperature Instability on Digital Circuit Reliability," Proceedings of the 40th Annual Reliability Physics Symposium, Apr. 7-11, 2002, Dallas, Texas, IEEE, pp. 248-254.
Shimizu, A. et al., "Separation of Fast and Slow NBTI Components Under Long-Term Stress in pMISFETs with Ultra-Thin high-k and SiON Dielectrics," IEEE International Reliability Physics Symposium (IRPS), Apr. 27-May 1, 2008, Phoenix, AZ, IEEE, pp. 669-670.
Yeom, H. et al., "0-30 V Common Mode Range, 120 dB CMRR, and 10 nV/sqHz Noise Floor Current Shunt Monitor IC with an Embedded ΣΔ Modulated Digital Interface," Analog Integrated Circuits and Signal Processing, vol. 73, Issue 1, Oct. 2012, Springer Science+Business Media, LLC, pp. 339-351.

* cited by examiner $$I_D \propto \exp\left(\frac{-V_G + V_{t,pre}}{m\phi_t}\right) \quad (1)$$

$$I_D \propto \exp\left(\frac{-V_G + V_{t,pst}}{m\phi_t}\right) \quad (2)$$

$$V_t = \Delta V + V_{t,pre} \quad (3)$$

$$\therefore$$

$$I_D \propto \exp\left(\frac{-V_G + \Delta V + V_{t,pre}}{m\phi_t}\right) \quad (4)$$

$$I_D \propto \exp\left(\frac{-V_G * + V_{t,pre}}{m\phi_t}\right) \quad (5)$$

where (6)

$$V_G * = V_G - \Delta V$$

*FIG. 4A*

$$\Delta V = -\frac{qN_{ot}}{C_{ox}} + \frac{qD_{it}\phi_B}{C_{ox}} - \frac{qD_{it}\psi_S}{C_{ox}} \tag{7}$$

where the surface potential $$\psi_S \approx \frac{C_{ox}}{C_{dm} + \xi C_{ox}}\left(V_{t,pst} - V_G\right) + 2\phi_B \tag{8}$$

where $\xi = 1 + \frac{qD_{it}}{C_{ox}}$ and a$\psi_S - 2\phi_B$ is small $$\therefore \quad \Delta V \approx -\frac{qN_{ot}}{C_{ox}} - \frac{qD_{it}\phi_B}{C_{ox}} - \frac{qD_{it}}{C_{dm} + \xi C_{ox}}\left(V_{t,pst} - V_G\right) \tag{9}$$

Now $$V_{t,pst} \approx -\frac{qN_{ot}}{C_{ox}} - \frac{qD_{it}\phi_B}{C_{ox}} + V_{t,pre} \tag{10}$$

So $$\Delta V \approx -\frac{qN_{ot}}{C_{ox}} - \frac{qD_{it}\phi_B}{C_{ox}} - \frac{qD_{it}}{C_{dm} + \xi C_{ox}}\left(-\frac{qN_{ot}}{C_{ox}} - \frac{qD_{it}\phi_B}{C_{ox}} + V_{t,pre} - V_G\right) \tag{11}$$

*FIG. 4B*

We know $$\frac{qD_{it}}{C_{dm}+\xi C_{ox}} = \frac{qD_{it}}{mC_{ox}} \tag{12}$$

So $$\Delta V \approx -\underbrace{\frac{qN_{ot}}{C_{ox}}}_{\text{VOT}} + \underbrace{\frac{qD_{it}}{mC_{ox}}V_G}_{\text{VITV}} \underbrace{-\underbrace{\frac{qD_{it}\phi_B}{C_{ox}}}_{\text{VSA}} + \underbrace{\frac{qD_{it}}{mC_{ox}}\frac{qN_{ot}}{C_{ox}}}_{\text{VSB}} + \underbrace{\frac{qD_{it}}{mC_{ox}}\frac{qD_{it}\phi_B}{C_{ox}}}_{\text{VSC}} - \underbrace{\frac{qD_{it}}{mC_{ox}}V_{t,pre}}_{\text{VSD}}}_{\text{VITF}} \tag{13}$$

FIG. 4C $$\Delta V' \approx \underbrace{-\frac{qN_{ot}}{C_{ox}}}_{VOT'} + \underbrace{\frac{qD_{it}}{mC_{ox}} V_G}_{VITV'} \underbrace{\underbrace{-\frac{qD_{it}\phi_B}{C_{ox}}}_{VSA'} + \underbrace{\frac{qD_{it}}{mC_{ox}} \frac{qN_{ot}}{C_{ox}}}_{VSB'} + \underbrace{\frac{qD_{it}}{mC_{ox}} \frac{qD_{it}\phi_B}{C_{ox}}}_{VSC'} \underbrace{- \frac{qD_{it}}{mC_{ox}} V_{t,pre}}_{VSD'}}_{VITF'} \qquad (14)$$

FIG. 12

PHYSICS-BASED RELIABILITY MODEL FOR LARGE-SCALE CMOS CIRCUIT DESIGN

RELATED APPLICATION

This application claims the benefit of provisional patent application Ser. No. 61/734,533, filed Dec. 7, 2012, the disclosure of which is hereby incorporated herein by reference in its entirety.

STATEMENT OF GOVERNMENT SUPPORT

This invention was made with government support under FA9453-07-C-0186 awarded by AFRL/IF. The government has certain rights in the invention.

FIELD OF THE DISCLOSURE

This disclosure relates generally to systems and methods for modeling integrated circuit (IC) components.

BACKGROUND

Reliability simulations are critical for lifetime prediction and verification of long-term performance of integrated circuits (ICs). The increasing concern regarding the reliability of ICs has led to recent advancement in the understanding of the physical mechanisms (i.e., charge degradation effects) responsible for the temporal degradation of physical active semiconductor components. However, circuit simulations for these physical active semiconductor components generally require reprogramming in order to simulate charge degradation effects. For example, semiconductor fabricators generally provide IC designers with design kits that include in silico active semiconductor components. In this manner, the IC designers can use the design kit to create circuit simulations with the in silico active semiconductor components from the design kit and thereby test the viability of their IC designs. Unfortunately, the in silico active semiconductor components generally do not model charge degradation effects. Thus, the in silico active semiconductor components must often be reprogrammed in order to simulate these effects. Furthermore, existing techniques for reliability simulation modeling use threshold voltage shifts that do not reflect bias-dependent or stress-induced defects. Accordingly, what is needed are techniques that model charge degradation effects with greater fidelity and without requiring the reprogramming of in silico active semiconductor components.

SUMMARY

This disclosure relates generally to systems and methods for simulating physical active semiconductor components using in silico active semiconductor components. The in silico active semiconductor components are computer models that are configured to operationally simulate the physical active semiconductor components. Circuit simulations may be implemented in order to simulate one or more charge degradation effects in the in silico active semiconductor component. However, the systems and methods described herein allow for the charge degradation effect(s) to be simulated without having to reprogram the in silico active semiconductor component.

To simulate the charge degradation effect(s) in a circuit simulation, a simulated input signal is generated that has a simulated signal level. Additionally, a simulated defect signal level is produced. More specifically, the simulated defect signal level simulates at least one charge degradation effect in the in silico active semiconductor component as a function of simulation time and the simulated input signal level of the simulated input signal. As such, the charge degradation effect(s) are simulated externally with respect to the in silico active semiconductor component. The simulated input signal level of the simulated input signal may then be adjusted in accordance with the simulated defect signal level. Finally, the in silico active semiconductor component is implemented so as to generate a simulated output signal in response to the simulated input signal after the simulated input signal level of the simulated input signal is adjusted in accordance with the simulated defect signal level. In this manner, the in silico active semiconductor component is implemented, but the charge degradation effect(s) are provided by the adjustment of the simulated input signal in accordance with the simulated defect signal level. Therefore, the charge degradation effect(s) are simulated without requiring the in silico active semiconductor component to be reprogrammed.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

FIGS. 4A-4C illustrate various equations that describe several functions used to determine the charge degradation effect function implemented by the circuit simulation shown in FIG. 2.

Figure 2:
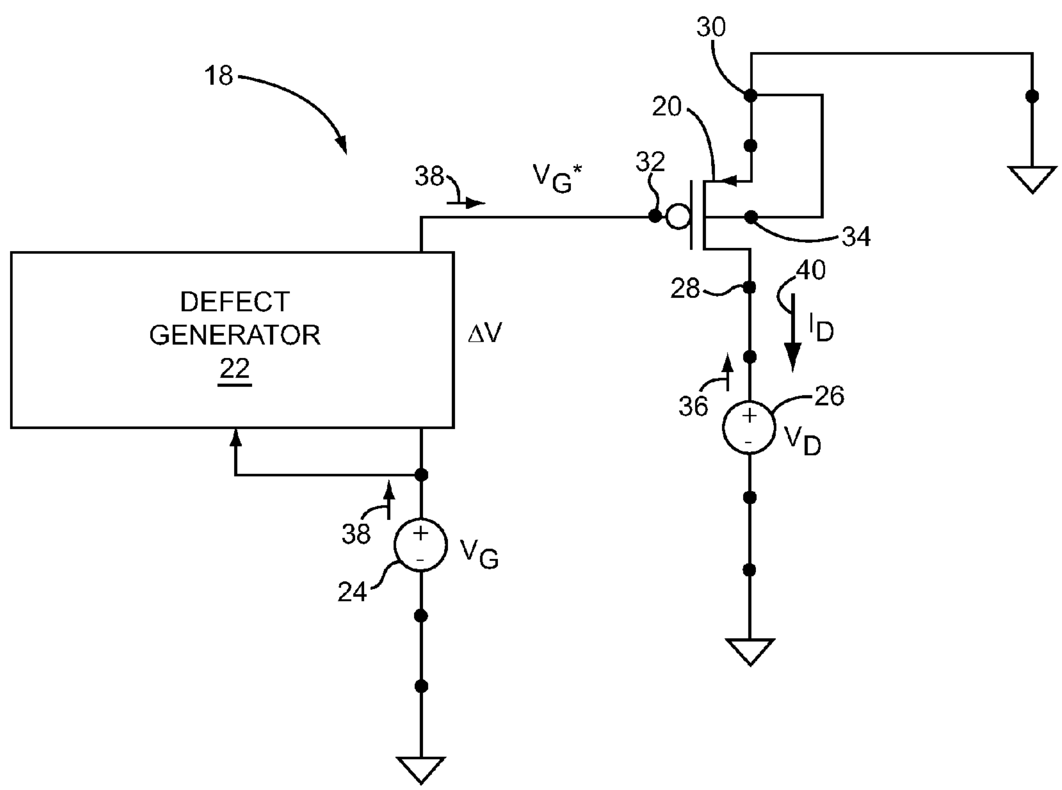
FIG. 2 is a visual illustration of one embodiment of a circuit simulation that includes an in silico field effect transistor (FET) and a defect generator for the in silico FET in order to simulate one or more charge degradation effects in the in silico FET.
Figure 6A:
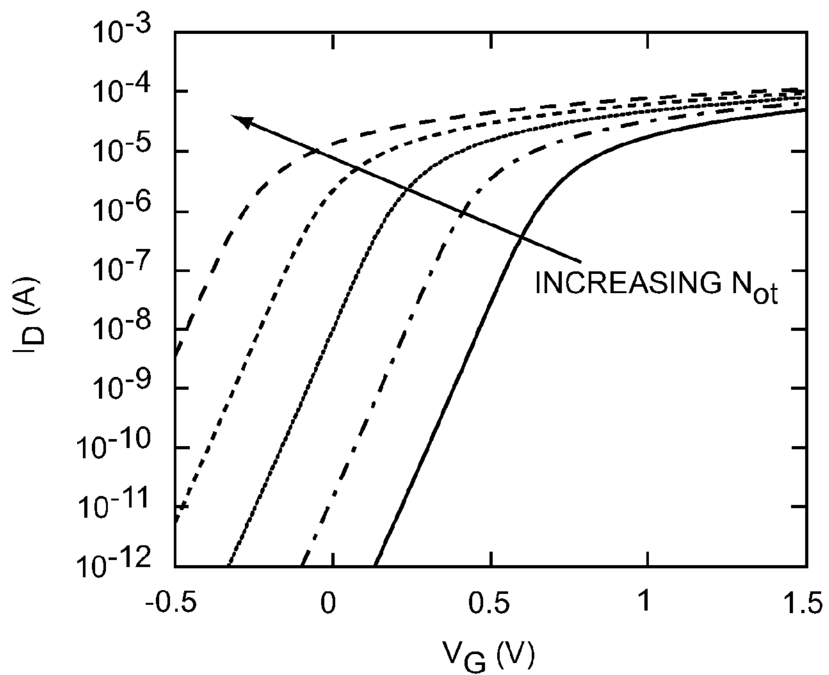
Figure 6B:
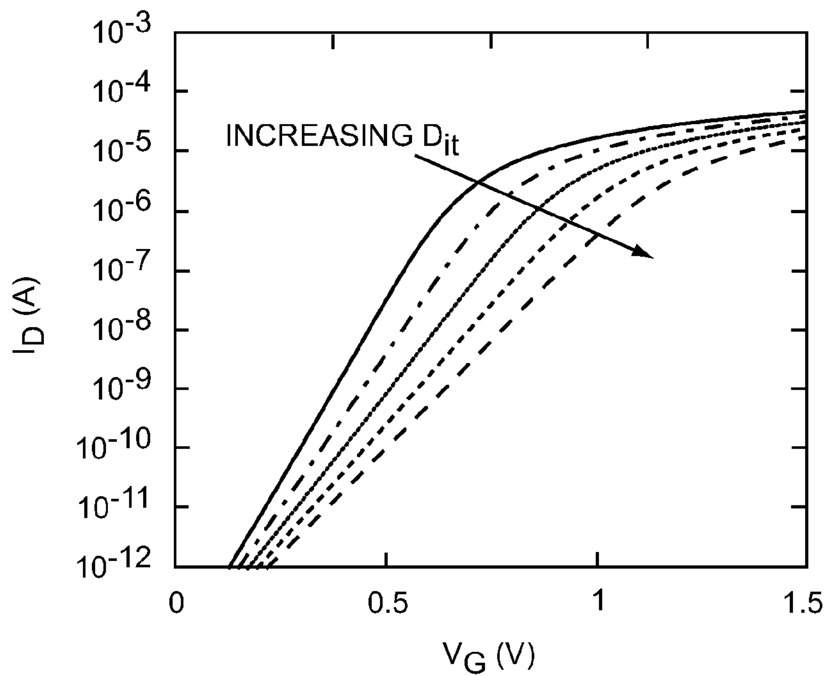

FIGS. 6A-6B demonstrate the charge degradation effects resulting from the charge density of the charge traps and the charge density of the interface traps for the in silico FET shown in FIG. 2.

Figure 7:
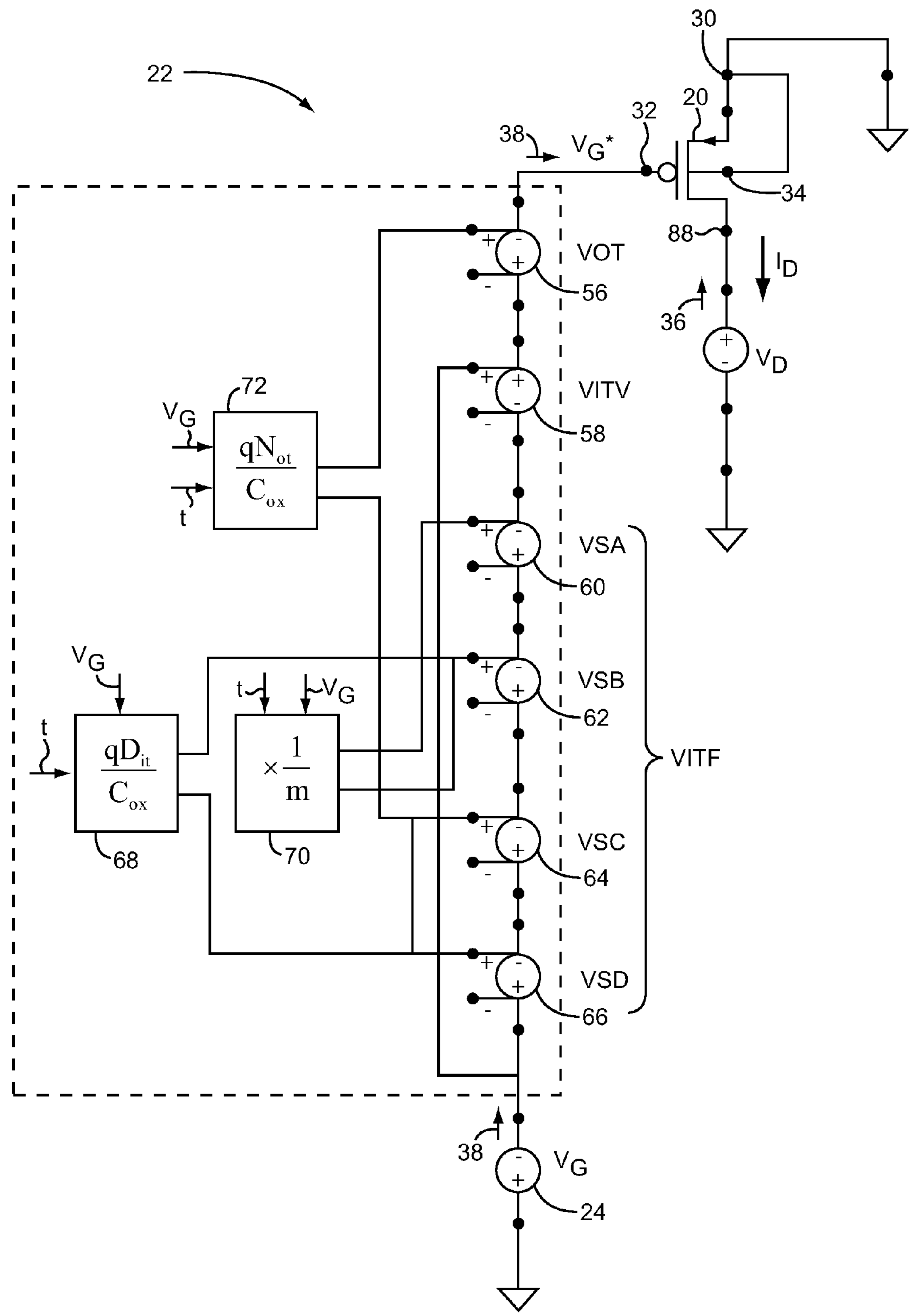

FIG. 7 illustrates an exemplary embodiment of the circuit simulation and the defect generator shown in FIG. 2.

Figure 8:
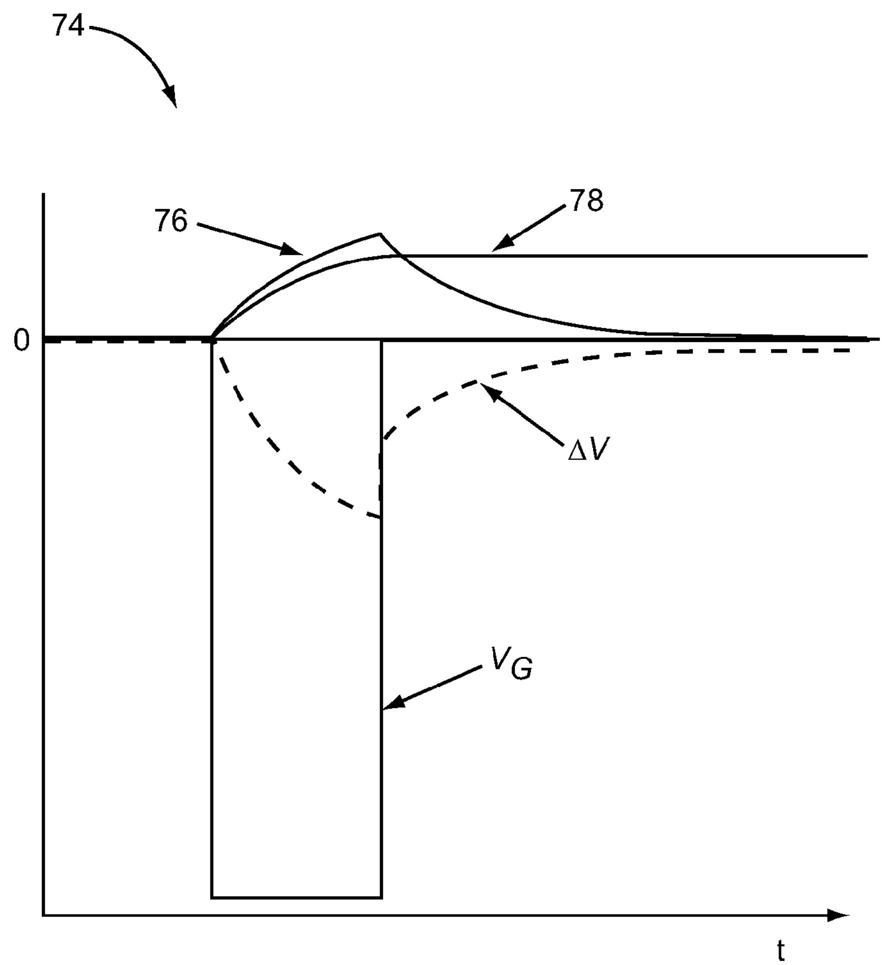

FIG. 8 illustrates exemplary plots of one embodiment of a defect profile for the circuit simulation shown in FIG. 2 versus a simulation time.

Figure 9A:
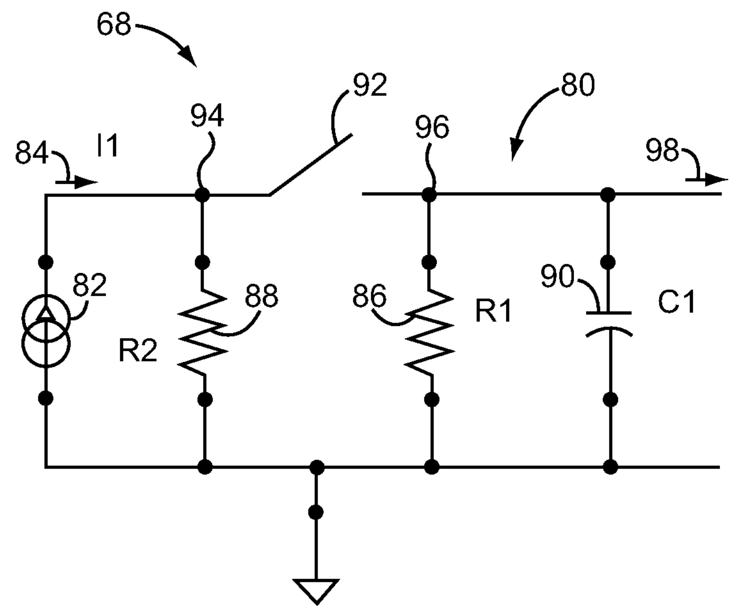

FIG. 9A illustrates one exemplary embodiment of a charge factor effect subgenerator in the defect generator shown in FIG. 7, when the charge factor effect subgenerator is provided as a simulated subcircuit.

Figure 9B:
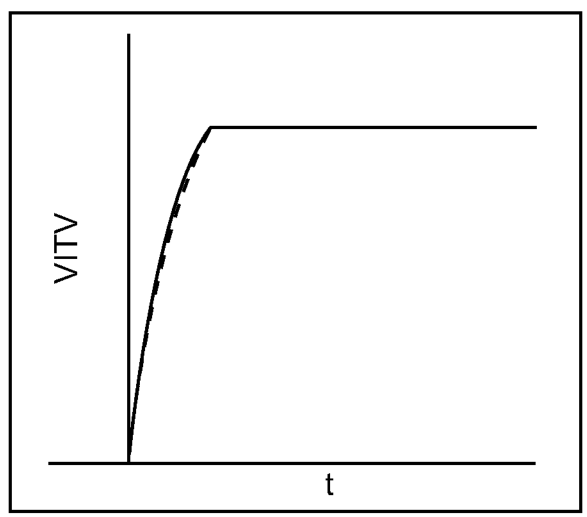

FIG. 9B illustrates an exemplary embodiment that depicts a simulated subdefect voltage level versus the simulation time for the simulated subcircuit shown in FIG. 9A.

Figure 10A:
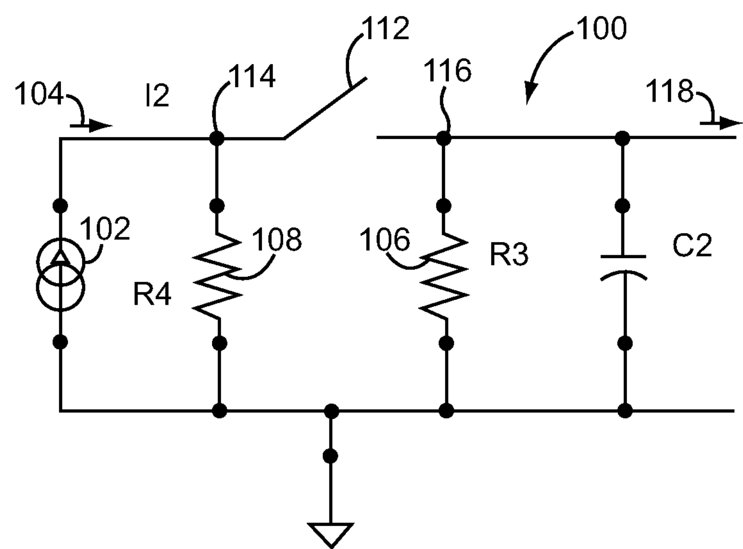

FIG. 10A illustrates one exemplary embodiment of another charge factor effect subgenerator in the defect generator shown in FIG. 7, when the charge factor effect subgenerator is provided as another simulated subcircuit.

Figure 10B:
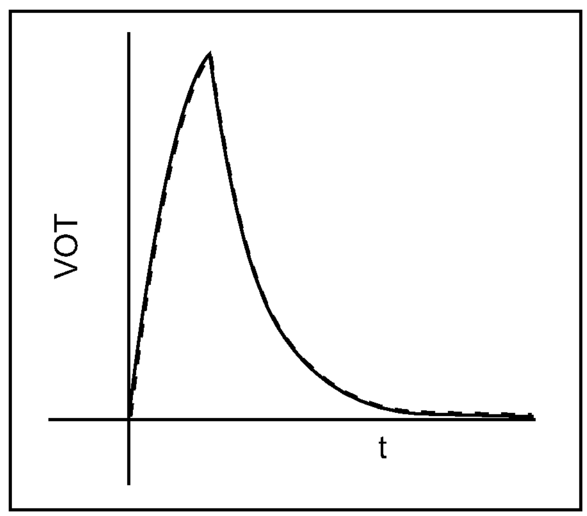

FIG. 10B illustrates an exemplary embodiment of a graph that depicts a simulated subdefect voltage level versus the simulation time for the simulated subcircuit shown in FIG. 10A.

Figure 11:
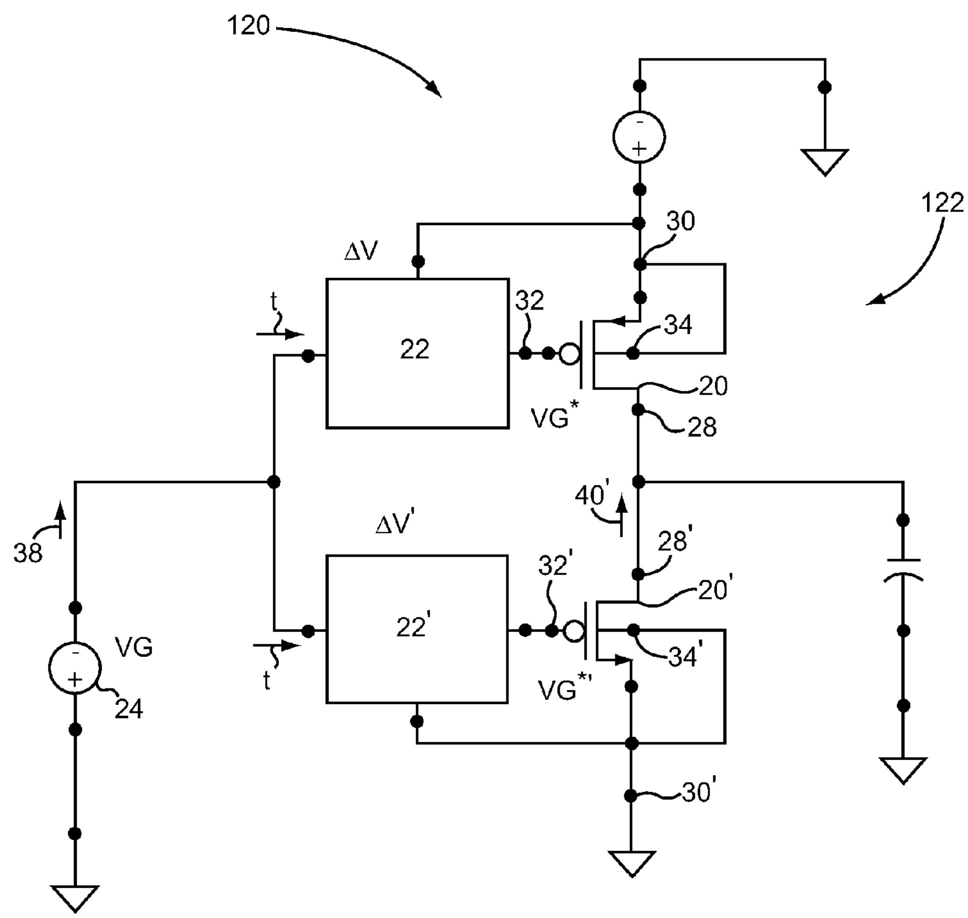

FIG. 11 is a visual illustration of another embodiment of a circuit simulation for an in silico inverter that may be implemented by a computer system to perform one embodiment of the exemplary procedures described above in FIG. 1.

FIG. 12 illustrates an equation that may be utilized to solve the charge degradation effect function implemented by a defect generator shown in FIG. 11.

Figure 13:
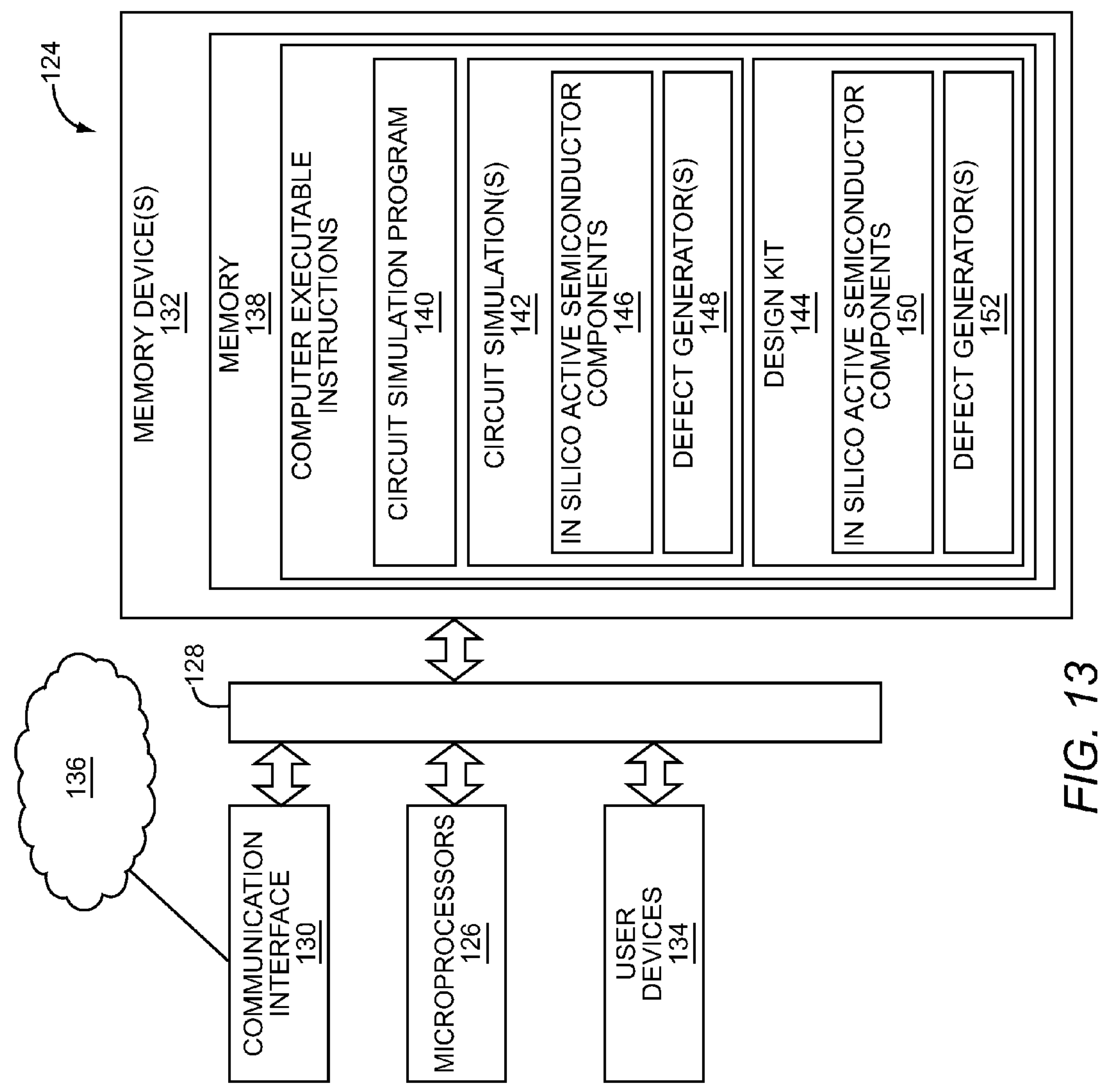

FIG. 13 illustrates one embodiment of a computer system that may be used to implement the procedures described above in FIGS. 1 and 3.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

This disclosure relates generally to system and methods for simulating physical active semiconductor components. More specifically, embodiments of systems and methods related to modeling physical active semiconductor components using in silico active semiconductor components. For example, in silico active semiconductor components are often provided by semiconductor fabricators to integrated circuit (IC) designers in design kits. These in silico active semiconductor components may be utilized to create circuit simulations with permutations of the in silico semiconductor components from the design kit in order to operationally simulate an IC design. The in silico semiconductor components in the circuit simulation (i.e., the permutations of the in silico semiconductor components from the design kit) operationally simulate the physical active semiconductor components that are fabricated by the semiconductor manufacturer. In this way, the IC designers can analyze the viability of their circuit designs in an inexpensive and cost-effective manner. For the sake of clarity, it should be noted that the term "physical" refers to IC components that are constructed or constructible on an actual semiconductor die. The term "in silico" refers to computer models configured to operationally simulate the physical IC components.

However, the in silico active semiconductor components provided in the design kits are often not able to simulate charge degradation effects that result from charge. The Complementary Metal-On-Oxide (CMOS) IC representations disclosed herein provide a new, more accurate approach to modeling aging effects, representing a significant improvement to threshold-based reliability simulation techniques. Not only do the CMOS IC representations simulate threshold voltage increases, the CMOS IC representations also model sub-threshold stretch-out and off-state current as well. Accordingly, both fixed charge and switching defects (interface and border traps) that build up or anneal in transistors during circuit operation are more accurately simulated by the CMOS IC representations. The CMOS IC representations are realized as a stress-dependent network that simulates the effects of oxide defect accumulation and recovery over time and can be implemented as a stand-alone subcircuit cell compatible with standard Electronic Design Automation (EDA) tools and Metal-on-Semiconductor Field Effect Transistor (MOSFET) compact models. Moreover, the CMOS IC representations can be implemented in circuit design tools without costly modifications to transistor compact model representations. For example, the CMOS IC representations may be implemented as stand-alone subcircuit cells compatible with standard EDA tools and MOSFET compact models.

Figure 1:
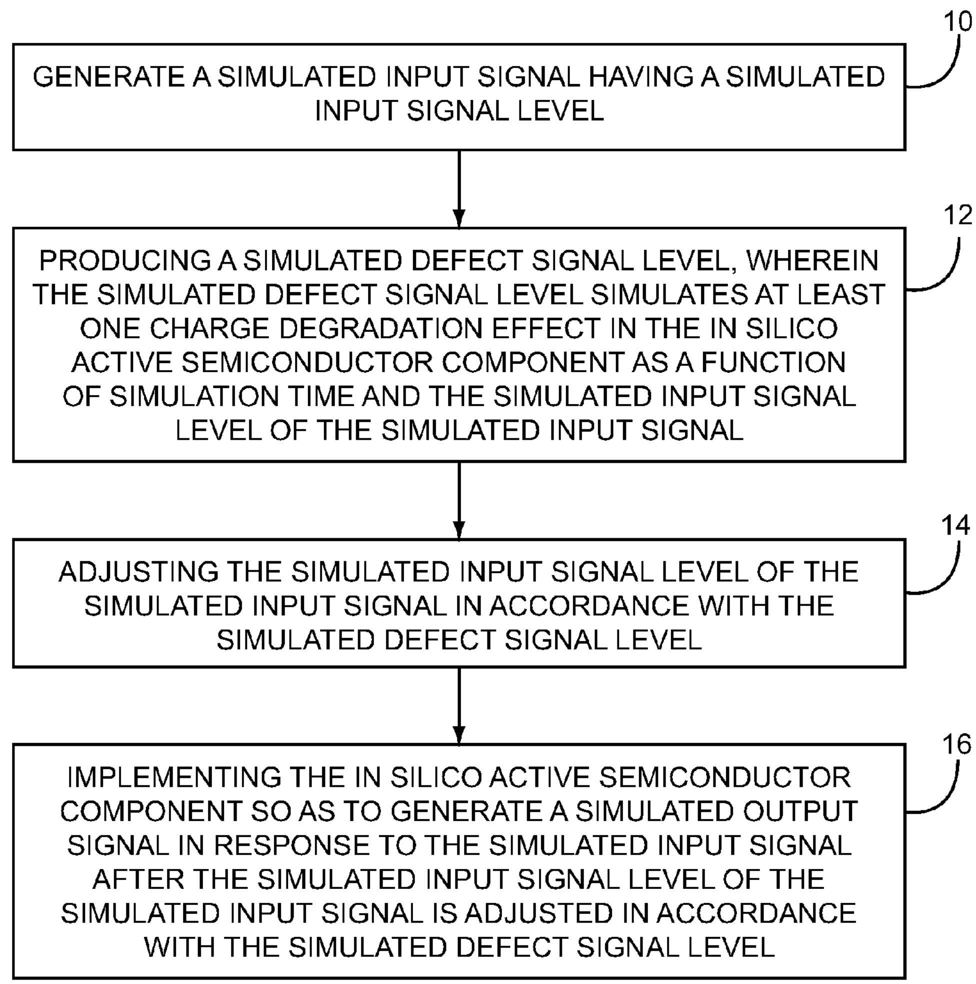
FIG. 1 illustrates exemplary procedures of a method of simulating a physical active semiconductor component using an in silico active semiconductor component, wherein a circuit simulation includes a defect generator in order to simulate one or more charge degradation effects in the in silico active semiconductor component.

FIG. 1 illustrates exemplary procedures of a method of simulating a physical active semiconductor component using an in silico active semiconductor component that does not require that the in silico active semiconductor component be reprogrammed in order to simulate one or more charge degradation effects. The in silico active semiconductor component is configured to operationally simulate the physical active semiconductor component. Thus, the in silico active semiconductor component is a computer model of the physical active semiconductor component and may be implemented to simulate the behavior of the physical active semiconductor component. Of course, the fidelity of the in silico active semiconductor component depends on how accurately the in silico active semiconductor components emulates the physical processes that occur in the physical active semiconductor component. For example, the in silico active semiconductor may originally have been provided in a design kit from a semiconductor fabricator. Typically, the in silico active semiconductor components do not emulate charge degradation effects that occur in the physical active semiconductor component. The method described in FIG. 1 may be used to simulate the physical active semiconductor component while simulating one or more charge degradation effects, even though the in silico active semiconductor component may not be programmed to model the charge degradation effects. As such, the method allows for charge degradation effects to be simulated without having to reprogram the in silico active semiconductor component provided in the design kit.

As described in further detail below, the method shown in FIG. 1 may be performed by a computer system with a suitable circuit simulation program. For instance, the circuit simulation program may be a version of a Simulation Program with Integrated Circuit Emphasis (SPICE), such as Personal SPICE (PSPICE), or a Very-Large-Scale Integration (VLSI) simulation program. To simulate the physical active semiconductor component using the in silico active semiconductor component during a circuit simulation, the computer system generates a simulated input signal having a simulated input signal level (Procedure 10). The simulated input signal is a computer simulation of a physical input signal provided to the physical active semiconductor component. The simulated input signal level of the simulated input signal varies as a function of the simulation time and may be provided as data values. The data values simulate a physical signal level of the physical input signal as the physical signal level varies through time. For instance, the simulated input signal level may simulate a current level, a voltage level, a power level, and/or the like of the physical input signal. Note that the simulated input signal may be generated in accordance with a script file in order to test or investigate the behavior of the in silico active semiconductor component. Furthermore, the simulated input signal may be generated as the output from another in silico component being simulated by the circuit simulation.

During the simulation, the computer system produces a simulated defect signal level, wherein the simulated defect signal level simulates at least one charge degradation effect in the in silico active semiconductor component as a function of a simulation time and the simulated input signal level of the simulated input signal (Procedure 12). To produce the simulated defect signal level, the computer system may implement a computer model that simulates dynamic physical mechanisms resulting in temporal degradation (i.e., aging) of the physical active semiconductor component. For example, negative-bias temperature instability (NBTI) and channel hot carrier (CHC) damage are prominent aging effects in many different types of physical active semiconductor components. In some physical active semiconductor components formed in a semiconductor substrate with a CMOS topology, both NBTI and CHC damage can be attributed to charge degradation effects such as charge trapping and/or interface traps that build up charge at a semiconductor/oxide interface of the physical active semiconductor component.

Charge trapping primarily occurs at electric field centers where weak Silicon-Silicon (Si—Si) bonds are broken, thereby capturing holes near an oxide interface within the physical active semiconductor component. Positively charged electric field centers can be easily neutralized by emitting holes. As such, charge trapping is considered the primary contributor to the recoverable component of NBTI. Unlike trapped holes resulting from charge trapping, interface traps created by the depassivation of silicon dangling bonds are often associated with long-term "permanent" aging effects. Once created, the occupancy of an interface trap depends on the position of the Fermi-level with respect to its energy level within the Si bandgap. In one embodiment, the computer system may implement the computer model, which calculates the simulated defect signal level to simulate the charge degradation effects, such as charge trapping and interface traps, thereby capturing the dynamic charge contribution resulting from stress conditions over time. The simulated defect signal level varies as a function of the simulation time and may be provided as data values. The data values simulate a physical effect of the charge contribution from the charge degradation effects internally within the physical active semiconductor component as the charge contribution varies over time.

As explained in further detail below, the simulated defect signal level may be produced by a defect generator provided in the circuit simulation between the in silico active semiconductor component and the simulated input signal. As such, the defect generator is configured to receive the simulated input signal prior to the in silico active semiconductor component within the circuit simulation. The computer system may implement the defect generator, which includes the computer model of the charge degradation effects, to produce the simulated defect signal level as a function of the simulation time and the simulated input signal level of the simulated input signal.

The computer system adjusts the simulated input signal level of the simulated input signal in accordance with the simulated defect signal level (Procedure 14). For example, with regard to the embodiment that uses the defect generator, the defect generator is configured to adjust the simulated input signal level of the simulated input signal in accordance with the simulated defect signal level before the simulated input signal is provided to the in silico active semiconductor component. The defect generator is configured to adjust the simulated input signal level in accordance with the simulated defect signal level dynamically over the simulated time period. Thus, the defect generator may be configured to produce the simulated defect signal level dynamically for each simulated time during the simulated time period and adjust the simulated input signal level dynamically throughout the simulated time period in accordance with the simulated defect signal level.

The computer system also implements the in silico active semiconductor component so as to generate a simulated output signal in response to the simulated input signal after the simulated input signal level of the simulated input signal is adjusted in accordance with the simulated defect signal level (Procedure 16). By adjusting the simulated input signal level dynamically throughout the simulated time period in accordance with the simulated defect signal level, the simulated input signal is received with the charge contribution from the charge degradation effect(s) built into the simulated input signal level of the simulated input signal. For instance, the in silico active semiconductor component is configured to receive the simulated input signal from the defect generator after the defect generator has adjusted the simulated input signal level in accordance with the simulated defect signal level. In this manner, the in silico active semiconductor component does not have to be reprogrammed in order to simulate charge degradation effect(s). As such, the in silico active semiconductor component may be utilized as provided in the design kit from a semiconductor fabricator without alteration to the in silico active semiconductor component (i.e., the computer model that operationally simulates the physical active semiconductor component). Rather, instead of altering the in silico active semiconductor component, the computer system produces the simulated defect signal level and dynamically adjusts the simulated input signal level in accordance with the simulated defect signal level. Thus, the simulated input signal is received by the in silico active semiconductor component with the charge contribution from the charge degradation effect(s) dynamically built into the simulated input signal level of the simulated input signal. Accordingly, the in silico active semiconductor component generates the simulated output signal based on the simulated input signal level already dynamically adjusted to simulate the charge degradation effect(s). Implementing the in silico active semiconductor component dynamically generates the simulated output signal having a simulated output signal level given the charge degradation effects of the charge degradation effect(s). However, this is achieved without having to reprogram the in silico active semiconductor component, but rather by integrating the charge degradation effect(s) into the simulated input signal level of the simulated input signal before the simulated input signal level is provided to the in silico active semiconductor component.

The in silico active semiconductor component may be any type of in silico active semiconductor component. For example, the in silico active semiconductor component may be configured to operate in any suitable circuit simulation program (e.g., PSPICE, VLSI program). Additionally, the in silico active semiconductor component may operationally simulate any type of physical active semiconductor component, including transistors (e.g., BJTs, FETs), diodes, thyristors, varactors, MEMS, LEDs, TRIACs, MJTs, photocells, and/or the like. Different embodiments of the exemplary procedures described in FIG. 1 may be performed in order to simulate one or more charge degradation effects using in silico active semiconductor components that operationally simulate the different types of physical active semiconductor components. For instance, different embodiments of a defect generator may be provided to produce the simulated defect signal level that simulates one or more charge degradation effects for each of the different types of physical active semiconductor components.

FIG. 2 is a visual illustration of one embodiment of a circuit simulation 18 that may be implemented by a computer system to perform one embodiment of the exemplary procedures described above with respect to FIG. 1. In this embodiment, the circuit simulation 18 includes an in silico FET 20, a defect generator 22, a signal simulation generator 24, and a signal simulation generator 26. The in silico FET 20 is one embodiment of the in silico active semiconductor component described above with respect to FIG. 1. In this embodiment, the in silico FET 20 is configured to operationally simulate a physical P-channel FET. Accordingly, the in silico FET 20 includes a simulated drain 28, a simulated source 30, a simulated gate 32, and a simulated body contact 34. In this embodiment, the signal simulation generator 26 is configured to generate a simulated supply voltage 36 having a simulated voltage level $V_D$. The simulated supply voltage 36 may be a simulated direct current (DC) voltage such that the simulated voltage level $V_D$ is constant. However, in some embodiments, the signal simulation generator 26 may dynamically simulate non-ideal behavior, and thus the simulated voltage level $V_D$ of the simulated supply voltage 36 may fluctuate throughout a simulated time period accordingly. As shown by the circuit simulation 18, the simulated source 30 of the in silico FET 20 is coupled to a simulated ground and to the simulated body contact 34.

The signal simulation generator 24 is configured to generate a simulated gate voltage 38, which is one embodiment of the simulated input signal described above with respect to FIG. 1. The signal simulation generator 24 generates the simulated gate voltage 38 having a simulated gate voltage level $V_G$ that varies dynamically throughout the simulated time period. (For the sake of clarity, the simulated gate voltage level is referred to as $V_G$ as generated by the signal simulation generator 24 and prior to adjustment by the defect generator 22, and is referred to as $V_G$* after adjustment by the defect generator 22.) In one example, the simulated gate voltage 38 may be a simulated radio frequency (RF) signal, and thus the simulated gate voltage level $V_G$ may vary dynamically to simulate a physical RF signal. The simulated gate voltage level $V_G$ is thus one embodiment of the simulated input signal level described above with respect to FIG. 1.

The defect generator 22 is a computer model that produces a simulated defect signal level ΔV, which is one embodiment of the simulated defect signal level described above with respect to FIG. 1. The simulated defect signal level ΔV simulates at least one charge degradation effect in the in silico FET 20 as a function of simulation time and the simulated gate voltage level $V_G$ of the simulated gate voltage 38. For example, the simulated defect signal level ΔV simulates a physical effect from charge contributions due to the charge degradation effects that occur internally within a physical P-channel FET. These charge contributions vary over time, and thus are simulated dynamically by the defect generator 22. In this embodiment, the simulated defect signal level ΔV simulates dynamic charge contributions from charge traps and interface traps within the physical P-channel FET.

As explained in further detail below, the function implemented by the defect generator 22 may be provided in accordance with a charge sheet model (CSM). In this manner, the defect generator 22 is configured to calculate the simulated defect signal level ΔV, which simulates dynamic charge contributions from charge traps and interface traps in the in silico FET 20. More specifically, the defect generator 22 is configured to receive the simulated gate voltage 38 having the simulated gate voltage level $V_G$ from the signal simulation generator 24. Implementing the defect generator 22 produces the simulated defect signal level ΔV as a function of the simulation time and the simulated gate voltage level $V_G$. The defect generator 22 is then configured to adjust the simulated gate voltage level $V_G$ in accordance with the simulated defect signal level ΔV so that the simulated gate voltage 38 has the simulated gate voltage level $V_G$* after adjustment.

The in silico FET 20 is configured to receive the simulated gate voltage 38 having the simulated gate voltage level $V_G$* after adjustment by the defect generator 22. The in silico FET 20 is implemented to generate a simulated drain current 40 having a simulated drain current level $I_D$. The simulated drain current 40 and the simulated drain current level $I_D$ are embodiments of the simulated output signal and the simulated output signal level described above with respect to FIG. 1. Thus, the simulated gate voltage 38 is received by the in silico FET 20 with the charge contribution from the charge degradation effects (e.g., charge traps and interface traps) dynamically built into the simulated gate voltage $V_G$* of the simulated gate voltage $V_G$. Accordingly, the in silico FET 20 generates the simulated drain current 40 based on the simulated gate voltage level $V_G$*, which has already been dynamically adjusted to simulate the charge degradation effects. Implementing the in silico FET 20 thus dynamically generates the simulated drain current 40 having the simulated drain current level $I_D$ given the charge contributions of the charge degradation effects. However, this is achieved without having to reprogram the in silico FET 20. Rather, the defect generator 22 integrates the charge degradation effects into the simulated gate voltage level $V_G$* of the simulated gate voltage 38 before the simulated gate voltage level $V_G$* is provided to the in silico FET 20.

Figure 3:
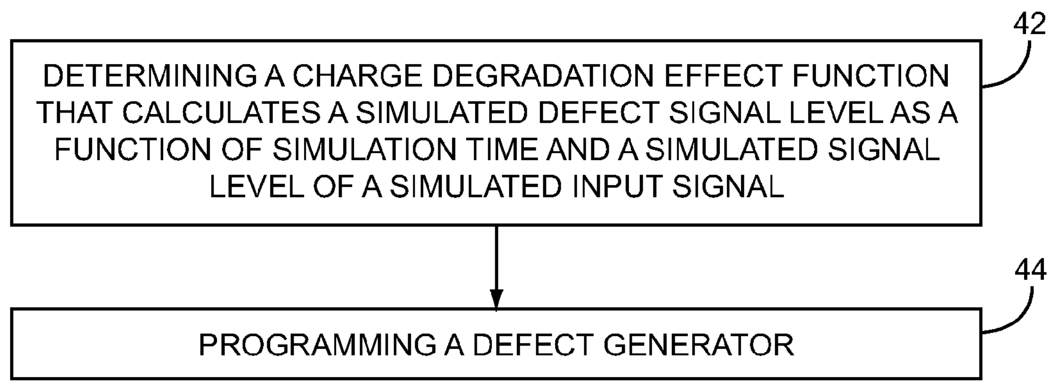
FIG. 3 illustrates one embodiment of exemplary procedures of a method of creating a computer model that simulates at least one charge degradation effect in an in silico active semiconductor component, such as the in silico FET shown in FIG. 2.

Referring now to FIG. 3, FIG. 3 illustrates one embodiment of exemplary procedures for a method of creating a computer model that simulates at least one charge degradation effect in an in silico active semiconductor component (e.g., the in silico FET 20 shown in FIG. 2). The computer model created by the exemplary procedures described in FIG. 3 is a defect generator (e.g., the defect generator 22 shown in FIG. 2). As explained above, the in silico active semiconductor component may be provided in a design kit from a semiconductor fabricator. The in silico active semiconductor component operationally simulates a physical active semiconductor component within a circuit simulation (e.g., the circuit simulation 18 shown in FIG. 2). By creating the defect generator, circuit simulations (such as the circuit simulation 18 shown in FIG. 2) of IC circuit designs can be created using the in silico active semiconductor component from the design kit without having to reprogram the in silico active semiconductor component in order to simulate one or more charge degradation effects.

In one embodiment, once the defect generator for the in silico active semiconductor component has been generated, the design kit may be programmed to insert the defect generator in the circuit simulation. More specifically, the design kit may be programmed to insert a permutation of the defect generator for each permutation of the in silico active semiconductor component provided within the circuit simulation. In this manner, the charge degradation effect(s) can be simulated without having to reprogram the in silico active semiconductor component within the design kit. It should be noted that the design kit may include various types of in silico active semiconductor components. Accordingly, different embodiments of the exemplary procedures shown in FIG. 3 may be implemented in order to generate defect generators for each of the different types of in silico active semiconductor components within the design kit.

To create the computer model (i.e., the defect generator) that simulates at least one charge degradation effect, a charge degradation effect function is determined that maps the simulation time and the simulated input signal level of the simulated input signal to the simulated defect signal level that simulates the at least one charge degradation effect in the in silico active semiconductor component (Procedure 42). In one embodiment, a defect-based compact modeling approach is used to determine the charge degradation effect function that captures the dynamic charge contribution of oxide-trapped charges and interface traps. The defect-based compact modeling approach takes into account the surface potential that results from defect densities in the physical active semiconductor component.

For example, the defect-based compact modeling approach enables a charge density $N_{ot}$ of oxide-trapped charges and a charge density $D_{it}$ of interface-trapped charges to be calculated independently. Thus, recovery of aging effects (e.g., as in NBTI) and/or annealing of radiation-induced degradation can be dynamically and independently modeled while maintaining the correct description of the bias-dependent charge contributions resulting from the charge density $N_{ot}$ of oxide-trapped charges and the charge density $D_{it}$ of interface-trapped charges. For example, the charge degradation effects resulting from the charge density $N_{ot}$ of oxide-trapped charges are typically attributed to the recoverable component in NBTI, while the charge degradation effects resulting from the interface-trapped charges $D_{it}$ are attributed to the permanent component of NBTI and to the non-recoverable damage due to hot carriers.

The defect-based compact modeling approach may thus be used to determine the charge degradation effect function for the defect generator. To determine the parameters for the charge degradation effect function, parameters for the charge degradation effect function may be extracted from the in silico active semiconductor component. Additionally and/or alternatively, the parameters may be determined analytically or empirically. The charge degradation effect function may include various subfunctions. With regard to the defect-based compact modeling approach, a subfunction may be determined that maps the simulation time and the simulated input signal level to the charge density $N_{ot}$ of oxide-trapped charges. Another subfunction may be determined that maps the simulation time and the simulated input signal level to the charge density $D_{it}$ of interface-trapped charges. The resulting defect generator is thus configured to calculate the charge density $N_{ot}$ of oxide-trapped charges and the charge density $D_{it}$ of interface-trapped charges independently. As explained in further detail below, still further subfunctions may map the charge density $N_{ot}$ of oxide-trapped charges and the charge density $D_{it}$ of interface trap charges to a simulated surface potential $\psi_S$ within the in silico active semiconductor component and then to the simulated defect signal level.

Since the defect-based compact modeling approach enables the charge degradation effects of the charge density $N_{ot}$ of oxide-trapped charges and the charge density $D_{it}$ of interface trap charges to be calculated independently, the charge degradation effect function may more accurately describe the physical processes taking place within the physical active semiconductor component. The defect-based compact modeling approach to determining the charge degradation effect function may thus provide greater accuracy than the threshold-voltage-based modeling approach. More specifically, the threshold-voltage-based modeling approach lacks the accuracy to describe the charge degradation effects for conditions other than at threshold and, in particular, the charge degradation effects resulting from the charge density $D_{it}$ of interface trap charges. Consequently, the charge degradation effect function determined from the defect-based modeling may have greater fidelity.

Once the charge degradation effect function is determined, the defect generator is programmed in accordance with the charge degradation effect function (Procedure 44). More specifically, the defect generator is programmed such that the defect generator is configured to receive the simulated input signal, receive the simulation time, implement the charge degradation effect function to calculate the simulated defect signal level from the simulated input signal level of the simulated input signal and the simulation time, and adjust the simulated input signal level of the simulated input signal in accordance with the simulated defect signal level. The defect generator may thus implement the charge degradation effect function dynamically to calculate the simulated defect signal level. Since the charge degradation effect function may be determined by the defect-based compact modeling approach, the defect generator may dynamically implement the subfunctions described above in order to implement the charge degradation effect function.

Referring now to FIGS. 2 and 4A-4C, FIGS. 4A-4C illustrate various equations that describe various functions used to determine the charge degradation effect function implemented by the circuit simulation 18 shown in FIG. 2. With regard to FIG. 4A, FIG. 4A illustrates various equations representing the computer model implemented by the circuit simulation 18. Equation (1) in FIG. 4A describes the implementation of the in silico FET 20 before the charge degradation effect(s) are taken into account (i.e., the defect generator 22 is deactivated), where:

$V_{t,pre}$=simulated threshold voltage level of the in silico FET 20

$\phi t$=simulated thermal voltage level of the in silico FET 20 m=slope factor of the in silico FET 20

Accordingly, equation (1) demonstrates that the simulated drain current level $I_D$ of the simulated drain current 40 is proportional to an exponential based on the simulated threshold voltage level $V_{t,pre}$, the simulated thermal voltage level $\phi_t$, and the slope factor m. Equation (2) in FIG. 4A describes the implementation of the in silico FET 20 after the charge degradation effect(s) are taken into account by the defect generator 22, where $V_{t,pst}$=the simulated threshold voltage level after the charge degradation effect(s) are taken into account. Equation (3) demonstrates that the simulated threshold voltage level $V_{t,pst}$ after the charge degradation effect(s) are taken into account is equal to the simulated defect signal level $\Delta V$ plus the simulated threshold voltage level $V_{t,pre}$ before the charge degradation effects are taken into account.

Equation (4) describes an exponential that is proportional to the simulated drain current level $I_D$ of the simulated drain current 40 given equation (3). Equation (5) rearranges equation (4) to demonstrate the exponential proportional to the simulated drain current level $I_D$ of the simulated drain current 40 in terms of the gate voltage level $V_G$* of the simulated gate voltage 38 after the defect generator 22 has adjusted the gate voltage level $V_G$ in accordance with the simulated defect signal level $\Delta V$. Equation (6) in FIG. 4A demonstrates that the simulated gate voltage level $V_G$* of the simulated gate voltage 38 after adjustment by the defect generator 22 is equal to the simulated gate voltage level $V_G$ prior to adjustment by the defect generator 22 plus the simulated defect signal level $\Delta V$.

One type of defect-based compact modeling approach that may be utilized to determine the simulated defect signal level $\Delta V$ is a surface potential approach.

FIG. 4B illustrates equations relevant to deriving the simulated defect signal level $\Delta V$ using the surface-potential approach. Equation (7) indicates the relationship between the simulated defect signal level $\Delta V$, the charge density $N_{ot}$ of the charge traps, the charge density $D_{it}$ of the interface traps, and the surface potential where:

q=the simulated accumulated charge $C_{ox}$=the oxide capacitance per unit area $\phi_B$=the bulk potential Equation (8) illustrates the approximate relationship between the surface potential $\psi_S$, the simulated gate voltage level $V_G$ prior to adjustment, and the simulated threshold voltage level $V_{t,pst}$ after adjustment, where $C_{dm}$=the capacitance of a depletion layer. Equation (9) illustrates determining the value of when the surface potential $\psi_S$ minus twice the bulk potential $\phi_B$ is small. Now placing equation (10) into equation (9), equation (11) indicates the relationship with the simulated defect signal level $\Delta V$. The charge degradation effect function is thus configured to map the charge density $N_{ot}$ of the charge traps, the charge density $D_{it}$ of the interface traps, the simulated accumulated charge q, and the simulated gate voltage level $V_G$ of the simulated gate voltage 38 prior to adjustment to the simulated defect signal level $\Delta V$. It should be noted that the charge density $N_{ot}$ of the charge traps, the charge density $D_{it}$ of the interface traps, and the accumulated charge q are each subfunctions of the simulation time and the simulated gate voltage level $V_G$ prior to adjustment. Thus, in this embodiment, the independent variables are the simulation time and the simulated gate voltage level $V_G$ prior to adjustment. Therefore, the charge degradation effect function is configured to map the charge density $N_{ot}$ of the charge traps, the charge density $D_{it}$ of the interface traps, the simulated accumulated charge q, and the simulated gate voltage level $V_G$.

FIG. 4C illustrates equations that may be utilized to solve the charge degradation effect function. In one embodiment, the charge degradation effect function is solved numerically using iterative techniques. To get rid of the capacitance $C_{dm}$ of the depletion layer, equation (12) is inserted into equation (11) to become equation (13). Equation (13) is an implicit function of the surface potential ψS and may be solved numerically using iterative techniques. For example, in order for the defect generator 22 to implement the charge degradation effect function, the charge density $N_{ot}$ of the charge traps and the charge density $D_{it}$ of the interface traps can be calculated independently. More specifically, the defect generator 22 may be configured to calculate the charge density $N_{ot}$ of the charge traps and/or the charge degradation effects of the charge density $N_{ot}$ of the charge traps independently as a subfunction of the simulation time and the simulated gate voltage level $V_G$ prior to adjustment. Similarly, the defect generator 22 may be configured to calculate the charge density $D_{it}$ of the interface traps and/or the charge degradation effects of the charge density $D_{it}$ of the interface traps can be calculated in independently as a subfunction of the simulation time and the simulated gate voltage level $V_G$ prior to adjustment. The defect generator 22 may then calculate the simulated accumulated charge q as a subfunction of the charge density $N_{ot}$ of the charge traps, the charge density $D_{it}$ of the interface traps, the simulated gate voltage level $V_G$ prior to adjustment, and the simulation time. Finally, the defect generator 22 may implement yet another subfunction, as provided in equation (13), to calculate the simulated defect signal level $\Delta V$ from the simulated accumulated charge q, the charge density $N_{ot}$ of the charge traps, the charge density $D_{it}$ of the interface traps, and the simulated gate voltage level $V_G$ prior to adjustment. It should be noted that with regard to equation (11) and equation (13), the oxide capacitance $C_{ox}$, the capacitance $C_{dm}$ of the depletion layer, the bulk potential $\phi_B$, and the simulated threshold voltage level $V_{t,pre}$ prior to adjustment may be parameters extracted from the in silico FET 20. Alternatively and/or additionally, the oxide capacitance $C_{ox}$, the capacitance $C_{dm}$ of the depletion layer, the bulk potential $\phi_B$, and the simulated threshold voltage level $V_{t,pre}$ may be determined empirically or analytically.

Referring again to equation (13) of FIG. 4C, equation (13) illustrates that the simulated defect signal level $\Delta V$ can be subdivided into a simulated subdefect voltage level VOT, which is based on the charge density $N_{ot}$ of the charge traps; a simulated subdefect voltage level VITV, which is based on the charge density $D_{it}$ of the interface traps; and a simulated subdefect voltage level VITF, which is based on both the charge density $N_{ot}$ of the charge traps and the charge density $D_{it}$ of the interface traps. Accordingly, the simulated defect signal level $\Delta V$ includes the simulated subdefect voltage level VOT, the simulated subdefect voltage level VITV, and the simulated subdefect voltage level VITF. The simulated subdefect voltage level VITV may be expressed as various simulated subdefect voltage levels, which in this embodiment are simulated subdefect voltage levels VSA, VSB, VSC, VSD. The simulated subdefect voltage level VITV thus includes the simulated subdefect voltage levels VSA, VSB, VSC, VSD. As explained in further detail below, in an alternative embodiment, the defect generator 22 includes various defect subgenerators that are configured to generate the generators that generate the simulated subdefect voltage levels VOT, VITV, VSA, VSB, VSC, and VSD.

In still another embodiment, the defect generator 22 is a simulated voltage controlled voltage source (VCVS) that implements a subfunction that produces the simulated defect signal level $\Delta V$ using closed-form analytical approximation techniques. The simulated defect signal level $\Delta V$ simulates the charge degradation effects of the charge density $N_{ot}$ and the charge density $D_{it}$ and can be modeled in SPICE using the VCVS using the procedures described above with regard to FIG. 3. The VCVS is implemented as a subcircuit "wrapper" that connects in series with the gate of the standard FET model (e.g., BSIM). A voltage (denoted as VDF) accounts for the bias-dependent shifts due to the stress-induced defect densities. The voltage VDF is equivalent to $\Phi_{nt}$ and is given by:

$$V_{DF}=f(V_G,N_{ot},D_{it})=q[N_{ot}-D_{it}(\psi_S-\Phi_b)]/C_{ox}$$

As described by the equation shown above, the bias dependence is contained in the calculation of the surface potential $\psi_s$. These calculations are for fixed charge densities $N_{ot}$ and $D_{it}$. It should be noted that the proposed modeling approach independently captures the effects of both the charge densities $N_{ot}$ and $D_{it}$ and is compatible with any compact modeling framework, since modifications to internal FET (compact model) parameters are not required. In this approach, the calculations of the surface potential $\psi_s$ and the voltage VDF are performed inside a Verilog-A module. For computational efficiency, a non-iterative algorithm is implemented to calculate the surface potential $\psi_s$ based on a closed-form analytical approximation of equation (13) shown in FIG. 4C. This charge degradation function maintains the effects of the charge densities $N_{ot}$ and $D_{it}$ introduced through $\Phi_{nt}$.

Figure 5:
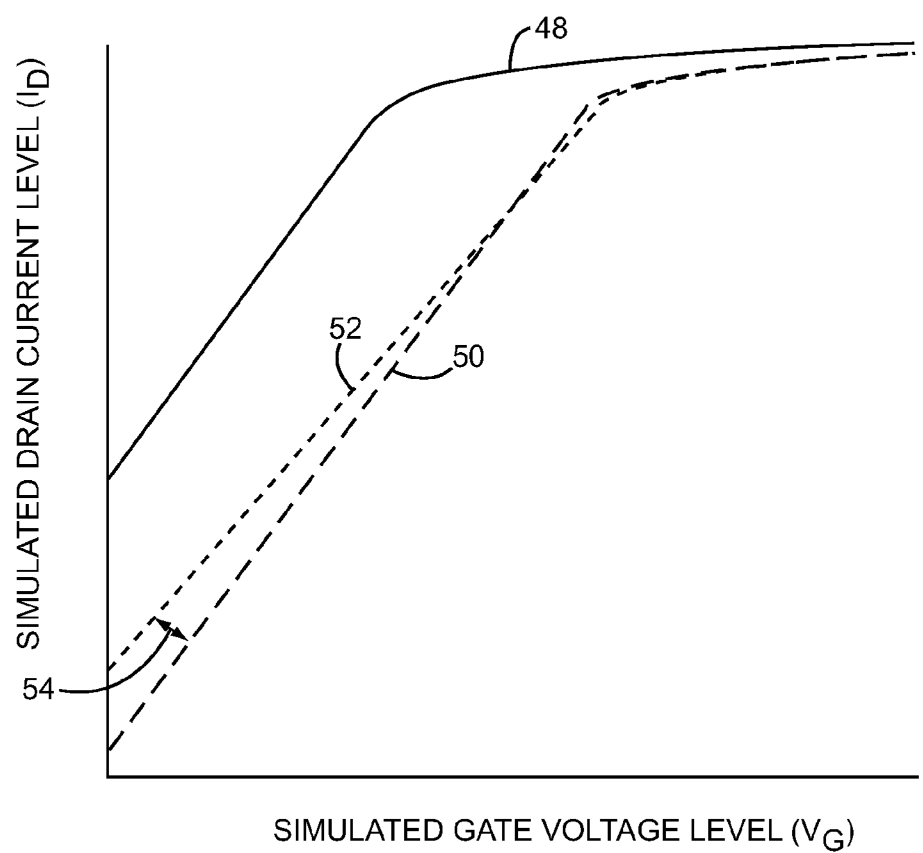
FIG. 5 illustrates various curves that describe a drain current level $I_D$ versus a simulated gate voltage level $V_G$ of a simulated gate voltage for the in silico FET shown in FIG. 2.

FIG. 5 illustrates various curves 48, 50, 52 that describe the simulated drain current level $I_D$ versus the simulated gate voltage level $V_G$ of the simulated gate voltage 38 for the circuit simulation 18 shown in FIG. 2. The curve 48 assumes that the simulated supply voltage 36 has a simulated supply voltage level that is constant and the same for each of the curves 48, 50, 52. More specifically, the curve 48 demonstrates the simulated drain current level $I_D$ when the defect generator 22 is deactivated. Thus, the curve 48 demonstrates the simulated drain current level $I_D$ that is provided by the in silico FET 20 versus the simulated gate voltage level $V_G$ when that takes the form:

$$\Delta V=q[N_{ot}-D_{it}(\psi_s-\Phi_b)/]C_{ox}$$

To calculate the charge density $N_{ot}$, the charge density $D_{it}$, and the accumulation charge q, subfunctions are implemented that calculate the charge density $N_{ot}$, the charge density $D_{it}$, and the accumulation charge q based on the simulated gate voltage level $V_G$ and the simulation time. More specifically, these subfunctions implement a CSM during each simulation cycle to thereby calculate the charge density $N_{ot}$, the charge density $D_{it}$, and the accumulation charge q based on the simulated gate voltage level $V_G$ and the simulation time provided to the defect generator 22 during every simulation cycle. Once the charge density $N_{ot}$, the charge density $D_{it}$, and the accumulation charge q are calculated, subfunctions are implemented to calculate the surface potential $\psi_S$. More specifically, the subfunctions implement a surface potential model (SPM) that calculates the surface potential $\psi_S$ in a closed loop non-iterative manner during each simulation cycle. The splitting of quasi-Fermi levels (see below) is contained within the calculation of the surface potential $\psi_S$. Once the charge density $N_{ot}$, the charge density $D_{it}$, the accumulation charge q, and the surface potential $\psi_S$ have been calculated, the subfunction for the simulated defect signal level ΔV shown above is implemented. The defect generator 22 is thus configured to implement a charge degradation function defined by the subfunctions for calculating the charge density $N_{ot}$, the charge density $D_{it}$, the accumulation charge q, the surface potential $\psi_s$, and the simulated defect signal level ΔV. Independent variables of the charge degradation function are thus the simulated gate voltage level $V_G$ prior to adjustment and the simulation time. The charge degradation function is implemented during each of the simulation cycles to simulate the charge degradation effects dynamically throughout a simulation time period.

In this embodiment, the simulated supply voltage 36 has a simulated supply voltage level $V_D$ that is constant and the same for each of the curves 48, 50, 52. More specifically, the curve 48 demonstrates the simulated drain current level $I_D$ when the defect generator 22 is deactivated. Thus, the curve 48 demonstrates the simulated drain current level $I_D$ that is provided by the in silico FET 20 versus the simulated gate voltage level $V_G$ when no charge degradation effects are being simulated. The curve 50 illustrates the simulated drain current level $I_D$ when the threshold-voltage-based defect model is used to simulate the charge degradation effect, which always assumes that conditions are at threshold. The curve 52 illustrates the simulated drain current level $I_D$ when the defect generator 22 described above is used to simulate the charge degradation effects from charge traps and interface traps. The defect generator 22 implements the charge effect degradation function described above with respect to FIG. 4C.

As can be seen in FIG. 5, there is a difference 54 between the curve 50 and the curve 52. Although the threshold-voltage-based defect models have been useful for capturing aging trends in physical active semiconductor components, the threshold-voltage-based defect models lack the physical accuracy to simulate the charge degradation effects of the charge density $N_{ot}$ of the charge traps and the charge density $D_{it}$ of the interface traps. This is particularly the case for the charge degradation effects resulting from the charge density $D_{it}$ of the interface traps within the in silico FET 20 for conditions less than threshold. Consequently, the difference 54 between the curve 50 and the curve 52 grows significantly as the simulated gate voltage level $V_G$ gets smaller with respect to the threshold voltage level. The difference 54 thus demonstrates the increase in accuracy achieved by the defect generator 22 with respect to threshold-voltage-based defect models.

To further demonstrate that the defect generator 22 is able to achieve greater fidelity than threshold-voltage-based defect models, FIGS. 6A-6B demonstrate the charge degradation effects resulting from the charge density $N_{ot}$ of the charge traps and the charge density $D_{it}$ of the interface traps in the circuit simulation 18 shown in FIG. 2. More specifically, FIG. 6A plots the simulated drain current level $I_D$ versus the simulated gate voltage level $V_G$ for an increasing charge density $N_{ot}$ of the charge traps when the charge density $D_{it}$ of the interface traps is held constant at a value of zero (0) and the simulated supply voltage level $V_D$ of the simulated supply voltage 36 is held at a value of 0.1 V. The increasing charge density $N_{ot}$ results in a fixed negative voltage shift (i.e., for positive trapped charges) that is equal in magnitude for all regions of operation of the surface potential $\psi_S$.

Analogously, FIG. 6B plots the simulated drain current level $I_D$ versus the simulated gate voltage level $V_G$. As the charge density $D_{it}$ of the interface traps increases, the charge density $N_{ot}$ of the charge traps is held constant at a value of zero (0) and the simulated supply voltage level $V_D$ of the simulated supply voltage 36 is held at a value of 0.1 V. In this case, increasing the charge density $D_{it}$ results in voltage shifts that vary with the surface potential $\psi_S$ due to the dynamic charge contribution from donor-like and acceptor-like interface traps. Thus, when the surface potential is not approximately equal to two times the bulk potential $\phi_B$ (i.e., non-equilibrium conditions), the bulk potential $\phi_B$ is split into quasi-Fermi levels. For example, when the surface potential is approximately equal to the bulk potential $\phi_B$, the charge contribution to the simulated accumulated charge q from all interface traps is neutral and there are no voltage shifts. This split of the bulk potential $\phi_B$ into quasi-Fermi levels results in the changes in the slopes of the curves shown in FIG. 6B and a majority of the difference 54 between the curve 50 and the curve 52 in FIG. 5. This split of the bulk potential $\phi_B$ into quasi-Fermi levels is thus not captured by the threshold-voltage-based defect models, since the threshold-voltage-based defect models assume constant threshold conditions. As such, by independently calculating the charge densities $N_{ot}$ and $D_{it}$ and/or their charge contributions, the defect generator 22 shown in FIG. 2 allows for the circuit simulation 18 to have greater fidelity than the threshold-voltage-based defect models without having to reprogram the in silico FET 20.

Referring now to FIG. 4C and FIG. 7, FIG. 7 illustrates the circuit simulation 18 shown in FIG. 2 with an exemplary embodiment of the defect generator 22. In this embodiment, the defect generator 22 includes various charge defect subgenerators 56, 58, 60, 62, 64, 66 and various charge factor effect subgenerators 68, 70, 72. As such, the various charge defect subgenerators 56, 58, 60, 62, 64, 66 and the various charge factor effect subgenerators 68, 70, 72 are configured to implement the charge effect degradation function. However, the charge effect degradation function is split into a variety of subfunctions wherein each of the various charge defect subgenerators 56, 58, 60, 62, 64, 66 and the various charge factor effect subgenerators 68, 70, 72 is configured to implement one of the subfunctions. More specifically, the charge defect subgenerator 56 is configured to produce the charge defect subvoltage VOT, which is based on the charge factor $qN_{ot}/C_{ox}$ as shown in FIG. 4C. The charge defect subgenerator 58 is configured to produce the charge defect subvoltage level VITV, which is based on the charge factor $qD_{it}/C_{ox}$ and the charge factor 1/m as shown in FIG. 4C. The charge defect subgenerator 60 is configured to produce the charge defect subvoltage level VSA, which is based on the charge factor $qD_{it}/C_{ox}$, as shown in FIG. 4C. The charge defect subgenerator 62 is configured to produce the charge defect subvoltage level VSB, which is based on the charge factor $qD_{it}/C_{ox}$, the charge factor 1/m, and the charge factor $qN_{ot}/C_{ox}$, as shown in FIG. 4C.

The charge defect subgenerator 64 is configured to produce the charge defect subvoltage level VSC, which is also based on the charge factor $qD_{it}/C_{ox}$ and the charge factor 1/m, as shown in FIG. 4C. Finally, the charge defect subgenerator 66 is configured to produce the charge defect subvoltage level VSD, which is based on the charge factor $qD_{it}/C_{ox}$ and the charge factor 1/m, as shown in FIG. 4C. The charge defect subgenerators 60, 62, 64, and 66 together produce the simulated subdefect voltage level VITF. Also, the charge defect subgenerators 56, 58, 60, 62, 64, 66 together produce the simulated defect signal level ΔV, which includes the simulated defect subvoltage levels VITV, VITV, VITF (i.e., the simulated defect subvoltage levels VSA, VSB, VSC, VSD).

In this embodiment, the charge defect subgenerator 66 is configured to receive the simulated gate voltage 38 from the signal simulation generator 24. The charge defect subgenerator 66 adjusts the simulated gate voltage level $V_G$ in accordance with the charge defect subvoltage level VSD. The charge defect subgenerator 64 receives the simulated gate voltage 38 from the charge defect subgenerator 66 and is configured to further adjust the simulated gate voltage level $V_G$ in accordance with the charge defect subvoltage level VSC. Next, the charge defect subgenerator 62 receives the simulated gate voltage 38 from the charge defect subgenerator 64 and is configured to further adjust the simulated gate voltage level $V_G$ in accordance with the charge defect subvoltage level VSB. Subsequently, the charge defect subgenerator 60 receives the simulated gate voltage 38 from the charge defect subgenerator 62 and is configured to further adjust the simulated gate voltage level $V_G$ in accordance with the charge defect subvoltage level VSA. Next, the charge defect subgenerator 58 receives the simulated gate voltage 38 from the charge defect subgenerator 60 and is configured to further adjust the simulated gate voltage level $V_G$ in accordance with the charge defect subvoltage level VITV. Finally, the charge defect subgenerator 56 receives the simulated gate voltage 38 from the charge defect subgenerator 58 and is configured to further adjust the simulated gate voltage level $V_G$ in accordance with the charge defect subvoltage level VOT. The simulated gate 32 of the in silico FET 20 is configured to receive the simulated gate voltage 38 with the simulated gate voltage level $V_G$* after each of the charge defect subgenerators 56, 58, 60, 62, 64, 66 has adjusted the simulated gate voltage level $V_G$ of the simulated gate voltage 38.

The various charge factor effect subgenerators 68, 70, 72 are each configured to implement a subfunction that maps the simulated gate voltage level $V_G$ prior to adjustment and the simulation time to the charge factor $qD_{it}/C_{ox}$, the charge factor 1/m, and the charge factor $qN_{ot}/C_{ox}$ respectively. The subfunctions implemented by the charge factor effect subgenerators 68, 70, 72 may each be rational functions approximated by polynomials in PSPICE or using Verilog. Alternatively, the charge factor effect subgenerators 68, 70, 72 may be implemented as simulated subcircuits that operate in accordance with the desired rational subfunctions for the charge factor $qD_{it}/C_{ox}$, the charge factor 1/m, and the charge factor $qN_{ot}/C_{ox}$.

For example, the charge factor effect subgenerators 68, 70, and 72 may each be configured to receive a simulation time t and the simulated gate voltage level $V_G$ prior to adjustment during each simulation cycle. The simulation time t may initially be set to a default start time value during an initial simulation cycle. For each subsequent simulation cycle, the simulation time t equals the simulation time t during the previous simulation cycle plus a time interval indicator Δt that indicates a discrete temporal quantity that describes an amount of time between the simulation cycles. The simulation time t is paired with the simulated gate voltage level $V_G$ as generated from a signal simulation generator 24 since the simulated gate voltage level $V_G$ is generated during each simulation cycle by the signal simulation generator 24. Since the subfunction of the charge factor effect subgenerator 68 is a rational function having variables that include the simulation time t and the simulated gate voltage level $V_G$, the charge factor effect subgenerator 68 is configured to produce the charge factor $qD_{it}/C_{ox}$ based on the charge factor $qD_{it}/C_{ox}$ during a previous simulation cycle, or based on a default starting value for the initial simulation cycle. As such, the charge factor effect subgenerator 68 is configured to produce the charge factor $qD_{it}/C_{ox}$ based on its historical behavior to more accurately model charge degradation effects. The charge factor $qD_{it}/C_{ox}$ is provided to the charge defect subgenerators, 58, 60, 62, 64 and 66 during each of the simulation cycles, wherein the charge factor $qD_{it}/C_{ox}$ is a variable for the subfunctions implemented by the charge defect subgenerators 58, 60, 62, 64, and 66.

Since the subfunction of the charge factor effect subgenerator 70 is also a rational function having variables that include the simulation time t and the simulated gate voltage level $V_G$, the charge factor effect subgenerator 70 is configured to produce the charge factor 1/m based on the charge factor 1/m during a previous simulation cycle or based on a default starting value for the initial simulation cycle. As such, the charge factor effect subgenerator 70 is configured to produce the charge factor 1/m based on its historical behavior to more accurately model charge degradation effects. The charge factor 1/m is provided to the charge defect subgenerators 58, 60, 64 and 66 during each of the simulation cycles, wherein the charge factor 1/m is a variable for the subfunctions implemented by the charge defect subgenerators 58, 60, 64 and 66.

Finally, since the subfunction of the charge factor effect subgenerator 72 is also a rational function having variables that include the simulation time t and the simulated gate voltage level $V_G$, the charge factor effect subgenerator 72 is configured to produce the charge factor $qN_{ot}/C_{ox}$ based on the charge factor $qN_{ot}/C_{ox}$ during a previous simulation cycle or based on a default starting value for the initial simulation cycle. As such, the charge factor effect subgenerator 72 is configured to produce the charge factor $qN_{ot}/C_{ox}$ based on its historical behavior to more accurately model charge degradation effects. The charge factor $qN_{ot}/C_{ox}$ is provided to the charge defect subgenerators 56 and 62 during each of the simulation cycles, wherein the charge factor $qN_{ot}/C_{ox}$ is a variable for the subfunctions implemented by the charge defect subgenerators 56 and 62.

FIG. 8 illustrates exemplary plots that illustrate one embodiment of a defect profile 74 for the circuit simulation 18 shown in FIG. 2 versus the simulation time t. The defect profile 74 demonstrates that the simulated defect signal level ΔV depends on the simulated gate voltage level $V_G$ prior to adjustment and on curves 76, 78. The curve 76 illustrates the charge factor $qN_{ot}/C_{ox}$ versus the simulation time t, while the curve 78 illustrates the charge factor $qD_{it}/C_{ox}$ versus the simulation time t. The dynamic temporal characteristics of the simulated defect signal level ΔV demonstrate that the charge degradation effects due to gate bias stress (i.e., charge degradation effect caused by the charge traps and the charge density $N_{ot}$) once the gate bias stress is removed, while switching states (i.e., charge degradation effect caused by the interface traps and the charge density $D_{it}$) remain relatively constant. This accurately models the charge degradation effects in a physical FET (e.g., a physical N-channel FET). The defect generator 22 shown in FIG. 2 also builds up the charge density $N_{ot}$ of the charge traps more quickly than the charge density $D_{it}$ of the interface traps under stress. For example, the simulated defect signal level ΔV, and thus the simulated gate voltage level $V_G$* after adjustment, may change significantly and non-monotonically over time. This demonstrates the flexibility of the techniques described in this disclosure to capture time dependent of charge degradation effects. Once the defect generator 22 is programmed, "defect mimicking" can be constructed as a transistor-level aging cell (e.g., the defect generator 22 shown in FIG. 2) during circuit design and/or analysis.

FIG. 9A illustrates one exemplary embodiment of the charge factor effect subgenerator 68 shown in FIG. 7, when the charge factor effect subgenerator 68 is provided as a simulated subcircuit 80. The simulated subcircuit 80 includes a simulated DC current source 82 that is configured to produce a simulated current 84 having a simulated DC current level I1. The simulated subcircuit 80 also includes a simulated resistor 86 having a simulated resistance of R1, a simulated resistor 88 having a simulated resistance R2, a simulated capacitor 90 having a simulated capacitance of C1, and a simulated switch 92 having a simulated input terminal 94 and a simulated output terminal 96. The simulated DC current source 82 and the simulated resistor 88 are coupled in parallel to each other and are coupled to the simulated input terminal 94 of the simulated switch 92. The simulated resistor 86 is coupled in parallel with the simulated capacitor 90 and they are coupled to the simulated output terminal 96 of the simulated switch 92.

The simulated subcircuit 80 is configured to generate a simulated charge factor voltage 98 having the simulated subdefect voltage level VITV, for the simulation time t, where:

$$VITV(t) = V_{PD}(1 - e^{\frac{t}{\tau 1}})u(t) - (1 - e^{\frac{t-T}{\tau 2}})u(u - T)$$

$$\tau 1 = (R2 \,||\, R2) * C1$$

$$\tau 2 = R1 * C1$$

$$V_{Pb} = (R1 \,||\, R2) * I1$$

During a simulation cycle, the values of the simulated resistance R1, the simulated resistance R2, the simulated DC current level I1, and a switching frequency of the simulated switch 92 are selected in accordance with the simulated gate voltage level $V_G$ and the simulation time t such that the simulated subdefect voltage level VITV is produced to equal the charge factor $qD_{it}/C_{ox}$.

Referring again to FIG. 9A and FIG. 9B, FIG. 9B illustrates an exemplary embodiment of a graph that depicts the simulated subdefect voltage level VITV versus the simulation time t. Since the charge degradation effects of interface traps either do not ease or ease very slowly, an RC time constant provided by R1*C1 is high. For example, the RC time constant provided by the simulated subcircuit 80 may be greater than 1 ms.

FIG. 10A illustrates one exemplary embodiment of the charge factor effect subgenerator 72 shown in FIG. 7, when the charge factor effect subgenerator 72 is provided as a simulated subcircuit 100. The simulated subcircuit 100 includes a simulated DC current source 102 that is configured to produce a simulated current 104 having a simulated DC current level I2. The simulated subcircuit 100 also includes a simulated resistor 106 having a simulated resistance of R3, a simulated resistor 108 having a simulated resistance R4, a simulated capacitor 110 having a simulated capacitance of C2, and a simulated switch 112 having a simulated input terminal 114 and a simulated output terminal 116. The simulated DC current source 102 and the simulated resistor 108 are coupled in parallel to each other and are coupled to the simulated input terminal 114 of the simulated switch 112. The simulated resistor 106 is coupled in parallel with the simulated capacitor 110 and they are coupled to the simulated output terminal 116 of the simulated switch 112.

The simulated subcircuit 100 is configured to generate a simulated charge factor voltage 118 having the simulated subdefect voltage level VOT, for the simulation time t, where:

$$VOT(t) = VT(1 - e^{\frac{t}{\tau 3}})u(t) - (1 - e^{\frac{t-T}{\tau 4}})u(t - T)$$

$$\tau 3 = (R3 \,||\, R4) * C2$$

$$\tau 4 = R3 * C2$$

$$VT = (R3 \,||\, R4) * I2$$

During a simulation cycle, the values of the simulated resistance R3, the simulated resistance R4, the simulated DC current level I2, and a switching frequency of the simulated switch 112 are selected in accordance with the simulated gate voltage level $V_G$ and the simulation time t such that the simulated subdefect voltage level VOT is produced to equal the charge factor qNot/Cox.

Referring again to FIG. 10A and FIG. 10B, FIG. 10B illustrates an exemplary embodiment of a graph that depicts the simulated subdefect voltage level VOT versus the simulation time t. Since the charge degradation effects of charge traps degrade quickly, the RC time constant provided by R3*C2 is low. For example, the RC time constant provided by the simulated subcircuit 100 may be significantly less than 1 ms.

FIG. 11 is a visual illustration of another embodiment of a circuit simulation 120 that may be implemented by a computer system to perform one embodiment of the exemplary procedures described above with respect to FIG. 1. The circuit simulation 120 operationally simulates an in silico inverter 122. In this embodiment, the in silico inverter 122 includes the in silico FET 20, the defect generator 22, and the signal simulation generator 26, described above with respect to FIG. 2. As mentioned above, the in silico FET 20 operationally simulates a physical P-channel FET. However, the in silico inverter 122 further includes an in silico FET 20' and a defect generator 22'. The in silico FET 20' is another embodiment of the in silico active semiconductor component described above with regard to FIG. 2. The in silico FET 20' shown in FIG. 11 is configured to operationally simulate a physical N-channel FET. Accordingly, the in silico FET 20' includes a simulated drain 28', a simulated source 30', a simulated gate 32', and a simulated body contact 34'. Thus, in this embodiment, both the simulated gate 32 of the in silico FET 20 and the simulated gate 32' of the in silico FET 20' are configured to receive the simulated gate voltage 38 from the signal simulation generator 26. Note that in this embodiment of the in silico inverter 122, the simulated drain 28' of the in silico FET 20' is coupled to the simulated drain 28 of the in silico FET 20. The simulated source 30' is coupled to simulated ground. Finally, the simulated body contact 34' is coupled to the simulated source 30'.

The defect generator 22 operates as described above with respect to FIG. 2 and thus is configured to produce the simulated defect signal level ΔV and adjust the simulated gate voltage level $V_G$ to the simulated gate voltage level $V_G*$ (i.e., $V_G+\Delta V$). However, the defect generator 22' is also configured to receive the simulated gate voltage 38 from the signal simulation generator 26 and is coupled to the simulated gate 32' of the in silico FET 20'. The defect generator 22' is configured to produce a simulated defect voltage level ΔV' so as to simulate the charge degradation effects within the in silico FET 20', which is a computer model of the physical N-channel FET. The in silico FET 20' is thus another embodiment of the in silico active semiconductor component described above with respect to FIG. 1. In other words, embodiments of the procedures described above in FIG. 1 are implemented with respect to the in silico FET 20' and the defect generator 22' to adjust the simulated gate voltage level $V_G$ of the simulated gate voltage 38.

As explained above, the signal simulation generator 24 generates the simulated gate voltage 38 having a simulated gate voltage level $V_G$ that varies dynamically throughout the simulated time period. (For the sake of clarity, the simulated gate voltage level is referred to as being $V_G$ as generated by the signal simulation generator 24 and prior to adjustment by the defect generator 22 and the defect generator 22', and is referred to as being $V_G*'$ after adjustment by the defect generator 22'.) Like the defect generator 22, the defect generator 22' is configured to receive the simulation time t and the simulated gate voltage 38 during each simulation cycle. The defect generator 22' is configured to receive the simulated gate voltage 38 having the simulated gate voltage level $V_G$ as provided by the signal simulation generator 24.

Furthermore, the defect generator 22' is configured to implement a charge degradation effect function to calculate the simulated defect signal level ΔV' from the simulated gate voltage level $V_G*'$ of the simulated gate voltage 38 and the simulation time t. Accordingly, the defect generator 22' is a computer model that produces the simulated defect voltage level ΔV', which is another embodiment of the simulated defect signal level ΔV described above with respect to FIG. 1. The simulated defect signal level ΔV' simulates at least one charge degradation effect in the in silico FET 20' as a function of the simulation time t and the simulated gate voltage level $V_G$ of the simulated gate voltage 38. For example, the simulated defect signal level ΔV simulates a physical effect of charge contribution from the charge degradation effects internally within a physical P-channel FET as the charge contribution varies through time. In this embodiment, the simulated defect signal level ΔV' simulates dynamic charge contributions from charge traps and interface traps within the physical N-channel FET. Thus, the charge degradation effect function implemented by the defect generator 22' may be provided in accordance with a CSM for the physical N-channel FET. In this manner, the defect generator 22' is configured to calculate the simulated defect signal level ΔV', which simulates dynamic charge contributions from charge traps and interface traps in the in silico FET 20'. Implementing the defect generator 22' produces the simulated defect signal level ΔV' as a function of the simulation time t and the simulated gate voltage level $V_G$. The defect generator 22' is then configured to adjust the simulated gate voltage level $V_G$ in accordance with the simulated defect signal level ΔV' so that the simulated gate voltage 38 has the simulated gate voltage level $V_G$".

The in silico FET 20' is configured to receive the simulated gate voltage 38 having the simulated gate voltage level $V_G*'$ after adjustment by the defect generator 22'. Based on the simulated gate voltage level $V_G*'$ of the simulated gate voltage 38, the in silico FET 20' is implemented to generate a simulated drain current 40' having a simulated drain current level $I_D'$. The simulated drain current 40' and the simulated drain current level $I_D'$ are embodiments of the simulated output signal and the simulated output signal level described above with respect to FIG. 1. Thus, the simulated gate voltage 38 is received by the in silico FET 20' with the charge contribution from the charge degradation effects (e.g., charge traps and interface traps) dynamically built into the simulated gate voltage $V_G*'$ of the simulated gate voltage 38. Accordingly, the in silico FET 20' generates the simulated drain current 40' based on the simulated gate voltage level $V_G*'$, which has already been dynamically adjusted to simulate the charge degradation effects.

Implementing the in silico FET 20' thus dynamically generates the simulated drain current 40' having the simulated drain current level $I_D'$ given the charge contributions of the charge degradation effects. However, this is achieved without having to reprogram the in silico FET 20'. Rather, the defect generator 22' integrates the charge degradation effects into the simulated gate voltage level $V_G*'$ of the simulated gate voltage 38 before the simulated gate voltage level $V_G*'$ is provided to the in silico FET 20'.

FIG. 12 illustrates an equation (14) that may be utilized to solve the charge degradation effect function implemented by the defect generator 22' that is coupled to the in silico FET 20' in the circuit simulation 120 shown in FIG. 11. Note that the equation shown in FIG. 12 is similar to the equation shown in FIG. 4C for the defect generator 22 (shown in FIGS. 2 and 11) for the in silico FET 20 (shown in FIGS. 2 and 11), except for the sign of some of the summands.

As such, embodiments of the procedures described above with respect to FIG. 3 may be implemented to create the defect generator 22' shown in FIG. 11. Accordingly, the defect-based compact modeling approach along with any of the other techniques described herein may be used to determine the charge degradation effect function of the defect generator 22'. The charge degradation effect function maps the simulation time t and the simulated gate voltage level $V_G$ of the simulated gate voltage 38 to the simulated defect signal level ΔV' that simulates the charge degradation effects in the in silico FET 20' shown in FIG. 11. The defect generator 22' shown in FIG. 11 may then be programmed in accordance with the charge degradation effect function, and may thus operate as described above with respect to FIG. 11. In this manner, the in silico FET 20' does not have to be reprogrammed to simulate charge degradation effects.

FIG. 13 illustrates one embodiment of a computer system 124 that may be used to implement the procedures described above in FIGS. 1 and 3. In this embodiment, the computer system 124 includes one or more microprocessor(s) 126, a system bus 128, a communication interface 130, one or more memory device(s) 132, and user devices 134.

The microprocessor(s) 126, the communication interface 130, the memory device(s) 132, and the user devices 134 are coupled to each other by the system bus 128. As is well known, the microprocessor(s) 130 are configured to communicate with the other devices by exchanging address, control, and data information over the system bus 128. The user devices 134 may include any type of input and/or output device used by a user such as displays, keyboards, a mouse, voice processors, etc. The communication interface 130 can be any device or set of devices configured to allow exchange of data to and from a network 136. The network 136 can be any type of network, including but not limited to a wired or wireless network, a private or public network, a local area network (LAN), a wide local area network (WLAN), and the Internet. The communication interface 130 can be configured to support any type of communication protocol desired.

The memory device(s) 132 include a computer-readable medium, such as memory 138 shown in FIG. 13. The memory 138 is configured to store computer-executable instructions that can be executed by the microprocessor(s) 126. More specifically, the computer-executable instructions include a circuit simulation program 140, circuit simulation(s) 142, and a design kit 144. The circuit simulation(s) 142 include in silico active semiconductor components 146 and one or more defect generators 148 that simulate charge degradation defects in the in silico active semiconductor components 146. Accordingly, when the microprocessor(s) 126 implement the circuit simulation program 140 (e.g., PSPICE, VLSI program) in order to run the circuit simulation(s) 142, the microprocessor(s) 126 implement embodiments of the procedures described above in FIG. 1. For example, the circuit simulation(s) 142 may include the circuit simulation 18 and the circuit simulation 120 shown in FIGS. 2 and 11. By implementing the circuit simulation program 140 to run the circuit simulations 18, 120, the microprocessor(s) 126 implement the in silico FET 20, the in silico FET 20', the defect generator 22, and the defect generator 22' as described above with respect to FIGS. 2 and 11.

The circuit simulation program 140 may also be implemented by the microprocessor(s) 126 to create the circuit simulations 142 and to create simulated components for the circuit simulations 142. Thus, the computer system 124 may be used to implement the procedures described above in FIG. 3. For example, the circuit simulation program 140 may be implemented in order to create and program the defect generator 22 and the defect generator 22' described above with respect to FIGS. 2 and 11. In this embodiment, the circuit simulation(s) 142 are created using the design kit 144. The design kit 144 includes one or more in silico active semiconductor components 150 and one or more defect generators 152. The in silico active semiconductor components 146 are compute model archetypes of the in silico active semiconductor components 146 used to create the circuit simulation(s) 142. Thus, the in silico active semiconductor components 146 in the circuit simulation(s) 142 are permutations of the in silico active semiconductor components 150 from the design kit 144. Originally, the design kit 144 may have been provided by a semiconductor fabricator without the defect generator(s) 152. However, in one embodiment, the design kit 144 is reconfigured in accordance to the procedures described above in FIG. 3 in order to create the defect generator(s) 152 in the design kit 144 for the in silico active semiconductor components 150. The defect generator(s) 148 in the circuit simulation(s) 142 are thus permutations of the defect generators(s) 152 from the design kit 144.

Those skilled in the art will recognize improvements and modifications to the preferred embodiments of the present disclosure. All such improvements and modifications are considered within the scope of the concepts disclosed herein and the claims that follow.

What is claimed is:

1. A method of simulating a physical active semiconductor component using an in silico active semiconductor component configured to operationally simulate the physical active semiconductor component, comprising:

generating a simulated input signal having a simulated input signal level;

producing a simulated defect signal level with a defect generator coupled to the in silico active semiconductor component, wherein the simulated defect signal level simulates at least one charge degradation effect in the in silico active semiconductor component as a function of simulation time and the simulated input signal level of the simulated input signal;

adjusting the simulated input signal level of the simulated input signal in accordance with the simulated defect signal level; and implementing the in silico active semiconductor component so as to generate a simulated output signal in response to the simulated input signal after the simulated signal level of the simulated input signal is adjusted in accordance with the simulated defect signal level.

2. The method of claim 1 wherein the in silico active semiconductor component comprises an in silico field effect transistor (FET) configured to operationally simulate a physical FET as the physical active semiconductor component.

3. The method of claim 1 wherein the simulated defect signal level is produced dynamically.

4. The method of claim 3 wherein the simulated input signal is adjusted dynamically in accordance with the simulated defect signal level.

5. The method of claim 1 wherein the simulated defect signal level simulates a physical effect from charge contributions due to the at least one charge degradation effect that occurs internally within the physical active semiconductor component.

6. The method of claim 1 wherein the simulated defect signal level simulates dynamic charge contributions from charge traps and interface traps within the physical active semiconductor component.

7. The method of claim 6 wherein the simulated defect signal level simulates the dynamic charge contributions from the charge traps and the interface traps independently.

8. The method of claim 6 wherein producing the simulated defect signal level comprises implementing a charge sheet model to calculate the dynamic charge contributions.

9. The method of claim 1 wherein the defect generator is configured to receive the simulated input signal prior to the adjusting of the simulated input signal level of the simulated input signal in accordance with the simulated defect signal level.

10. The method of claim 9 wherein adjusting the simulated input signal level of the simulated input signal in accordance with the simulated defect signal level comprises adjusting the simulated input signal level of the simulated input signal with the defect generator.

11. The method of claim 9 wherein the defect generator is configured to implement a charge degradation effect function to calculate the simulated defect signal level from the simulated input signal level of the simulated input signal and the simulation time.

12. The method of claim 11 wherein the defect generator comprises a simulated circuit that is configured to implement the charge degradation effect function to calculate the simulated defect signal level from the simulated input signal level of the simulated input signal and the simulation time.

13. A computer system, comprising:

one or more microprocessors; and memory configured to store computer-executable instructions, wherein when the computer-executable instructions are executed by the one or more microprocessors, the computer-executable instructions cause the one or more microprocessors to:

generate a simulated input signal having a simulated input signal level;

produce a simulated defect signal level with a defect generator coupled to the in silico active semiconductor component, wherein the simulated defect signal level simulates at least one charge degradation effect in an in silico active semiconductor component as a function of simulation time and the simulated input signal level of the simulated input signal;

adjust the simulated input signal level of the simulated input signal in accordance with the simulated defect signal level; and implement the in silico active semiconductor component so as to generate a simulated output signal in response to the simulated input signal after the simulated input signal level of the simulated input signal is adjusted in accordance with the simulated defect signal level.

14. The computer system of claim 13 wherein the in silico active semiconductor component comprises an in silico field effect transistor (FET) configured to operationally simulate a physical FET as a physical active semiconductor component.

15. The computer system of claim 13 wherein the computer-executable instructions cause the one or more microprocessors to produce the simulated defect signal level dynamically.

16. The computer system of claim 15 wherein the computer-executable instructions cause the one or more microprocessors to adjust the simulated input signal dynamically in accordance with the simulated defect signal level.

17. The computer system of claim 13 wherein the simulated defect signal level simulates a physical effect from charge contributions due to the at least one charge degradation effect that occurs internally within a physical active semiconductor component.

18. The computer system of claim 13 wherein the simulated defect signal level simulates dynamic charge contributions from charge traps and interface traps within a physical active semiconductor component.

19. The computer system of claim 18 wherein the simulated defect signal level simulates the dynamic charge contributions from the charge traps and the interface traps independently.

20. The computer system of claim 18 wherein the computer-executable instructions cause the one or more microprocessors to produce the simulated defect signal level by implementing a charge sheet model to calculate the dynamic charge contributions.

21. The computer system of claim 13 wherein the defect generator is configured to receive the simulated input signal prior to the adjusting of the simulated input signal level of the simulated input signal in accordance with the simulated defect signal level.

22. The computer system of claim 21 wherein the computer-executable instructions cause the one or more microprocessors to adjust the simulated input signal level of the simulated input signal in accordance with the simulated defect signal level by adjusting the simulated input signal level of the simulated input signal with the defect generator.

23. The computer system of claim 21 wherein the defect generator is configured to implement a charge degradation effect function to calculate the simulated defect signal level from the simulated input signal level of the simulated input signal and the simulation time.

24. The computer system of claim 23 wherein the defect generator comprises a simulated circuit that is configured to implement the charge degradation effect function to calculate the simulated defect signal level from the simulated input signal level of the simulated input signal and the simulation time.

25. A method of creating a computer model that simulates at least one charge degradation effect in an in silico active semiconductor component, comprising:

determining a charge degradation effect function that maps a simulation time and a simulated input signal level of a simulated input signal to a simulated defect signal level that simulates the at least one charge degradation effect in the in silico active semiconductor component; and programming a defect generator in accordance with the charge degradation effect function so that the defect generator is configured to:

receive the simulated input signal;

receive the simulation time;

implement the charge degradation effect function to calculate the simulated defect signal level from the simulated input signal level of the simulated input signal and the simulation time; and adjust the simulated input signal level of the simulated input signal in accordance with the simulated defect signal level.

* * * * *